(12) United States Patent
Yamazaki et al.

(10) Patent No.: US 9,166,180 B2
(45) Date of Patent: Oct. 20, 2015

(54) LIGHT EMITTING DEVICE HAVING AN ORGANIC LIGHT EMITTING DIODE THAT EMITS WHITE LIGHT

(71) Applicant: SEMICONDUCTOR ENERGY LABORATORY CO., LTD., Atsugi (JP)

(72) Inventors: Shunpei Yamazaki, Tokyo (JP); Toru Takayama, Kanagawa (JP); Mai Akiba, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/858,121

(22) Filed: Apr. 8, 2013

(65) Prior Publication Data
US 2013/0228763 A1      Sep. 5, 2013

Related U.S. Application Data

(60) Division of application No. 13/416,100, filed on Mar. 9, 2012, now Pat. No. 8,415,660, and a continuation of application No. 13/108,021, filed on May 16, 2011, now Pat. No. 8,134,149, and a division of application (Continued)

(30) Foreign Application Priority Data

Jun. 20, 2001     (JP) .................................. 2001-187351

(51) Int. Cl.
*H01L 29/08*      (2006.01)
*H01L 35/24*      (2006.01)
(Continued)

(52) U.S. Cl.
CPC .......... *H01L 51/0097* (2013.01); *H01L 27/326* (2013.01); *H01L 27/3244* (2013.01);
(Continued)

(58) Field of Classification Search
CPC ................................................. H01L 51/5253
USPC .................... 257/40, 59, 72, E51.018
See application file for complete search history.

(56) References Cited

U.S. PATENT DOCUMENTS

| | | | |
|---|---|---|---|
| 4,489,481 | A | 12/1984 | Jones |
| 4,599,538 | A | 7/1986 | Hidler et al. |

(Continued)

FOREIGN PATENT DOCUMENTS

| | | |
|---|---|---|
| EP | 0 777 280 | 6/1997 |
| EP | 0 986 104 | 3/2000 |

(Continued)

OTHER PUBLICATIONS

Hung.L et al., "Application of an ultrathin LiF/Al bilayer in organic surface-emitting diodes,", Appl. Phys. Lett. (Applied Physics Letters), Jan. 22, 2001, vol. 78, No. 4, pp. 544-546.

(Continued)

*Primary Examiner* — Ida M Soward
(74) *Attorney, Agent, or Firm* — Nixon Peabody LLP; Jeffrey L. Costellia

(57) ABSTRACT

The present invention has an object of providing a light-emitting device including an OLED formed on a plastic substrate, which prevents degradation due to penetration of moisture or oxygen. On a plastic substrate, a plurality of films for preventing oxygen or moisture from penetrating into an organic light-emitting layer in the OLED ("barrier films") and a film having a smaller stress than the barrier films ("stress relaxing film"), the film being interposed between the barrier films, are provided. Owing to a laminate structure, if a crack occurs in one of the barrier films, the other barrier film(s) can prevent moisture or oxygen from penetrating into the organic light emitting layer. The stress relaxing film, which has a smaller stress than the barrier films, is interposed between the barrier films, making it possible to reduce stress of the entire sealing film. Therefore, a crack due to stress hardly occurs.

8 Claims, 19 Drawing Sheets

Related U.S. Application Data

No. 12/175,516, filed on Jul. 18, 2008, now Pat. No. 7,952,101, and a division of application No. 11/043,283, filed on Jan. 27, 2005, now Pat. No. 7,420,208, and a division of application No. 10/174,547, filed on Jun. 19, 2002, now Pat. No. 6,849,877.

(51) Int. Cl.
| | |
|---|---|
| *H01L 51/00* | (2006.01) |
| *H01L 29/04* | (2006.01) |
| *H01L 29/10* | (2006.01) |
| *H01L 31/036* | (2006.01) |
| *H01L 31/0376* | (2006.01) |
| *H01L 31/20* | (2006.01) |
| *H01L 29/15* | (2006.01) |
| *H01L 51/52* | (2006.01) |
| *H01L 27/32* | (2006.01) |
| *H01L 51/56* | (2006.01) |

(52) U.S. Cl.
CPC .......... *H01L51/529* (2013.01); *H01L 51/5237* (2013.01); *H01L 51/5253* (2013.01); *H01L 51/56* (2013.01); *H01L 2221/68368* (2013.01); *H01L 2227/326* (2013.01); *H01L 2251/5315* (2013.01); *H01L 2251/5338* (2013.01)

(56) References Cited

U.S. PATENT DOCUMENTS

| | | |
|---|---|---|
| 5,107,175 A | 4/1992 | Hirano et al. |
| 5,124,204 A | 6/1992 | Yamashita et al. |
| 5,189,405 A | 2/1993 | Yamashita et al. |
| 5,244,820 A | 9/1993 | Kamata et al. |
| 5,266,746 A | 11/1993 | Nishihara et al. |
| 5,317,433 A | 5/1994 | Miyawaki et al. |
| 5,343,052 A | 8/1994 | Oohata et al. |
| 5,396,100 A * | 3/1995 | Yamasaki et al. ............. 257/390 |
| 5,438,241 A | 8/1995 | Zavracky et al. |
| 5,455,625 A | 10/1995 | Englander |
| 5,518,824 A | 5/1996 | Funhoff et al. |
| 5,543,947 A | 8/1996 | Mase et al. |
| 5,550,066 A | 8/1996 | Tang et al. |
| 5,572,045 A | 11/1996 | Takahashi et al. |
| 5,574,292 A | 11/1996 | Takahashi et al. |
| 5,583,369 A | 12/1996 | Yamazaki et al. |
| 5,627,364 A | 5/1997 | Codama et al. |
| 5,633,176 A | 5/1997 | Takasu et al. |
| 5,652,067 A | 7/1997 | Ito et al. |
| 5,674,304 A | 10/1997 | Fukada et al. |
| 5,681,759 A | 10/1997 | Zhang |
| 5,684,365 A | 11/1997 | Tang et al. |
| 5,686,360 A | 11/1997 | Harvey, III et al. |
| 5,693,956 A | 12/1997 | Shi et al. |
| 5,696,386 A | 12/1997 | Yamazaki |
| 5,736,207 A | 4/1998 | Walther et al. |
| 5,739,589 A | 4/1998 | Sugiura et al. |
| 5,750,267 A | 5/1998 | Takase et al. |
| 5,757,126 A | 5/1998 | Harvey, III et al. |
| 5,757,139 A | 5/1998 | Forrest et al. |
| 5,768,776 A | 6/1998 | Pendse |
| 5,771,562 A | 6/1998 | Harvey, III et al. |
| 5,811,177 A | 9/1998 | Shi et al. |
| 5,817,366 A | 10/1998 | Arai et al. |
| 5,821,138 A | 10/1998 | Yamazaki et al. |
| 5,834,327 A | 11/1998 | Yamazaki et al. |
| 5,886,365 A | 3/1999 | Kouchi et al. |
| 5,900,285 A | 5/1999 | Walther et al. |
| 5,909,038 A | 6/1999 | Hwang et al. |
| 5,909,081 A | 6/1999 | Eida et al. |
| 5,946,561 A | 8/1999 | Yamazaki et al. |
| 5,952,708 A | 9/1999 | Yamazaki |
| 5,952,778 A | 9/1999 | Haskal et al. |
| 5,953,094 A | 9/1999 | Matsuoka et al. |
| 5,962,962 A | 10/1999 | Fujita et al. |
| 5,973,449 A | 10/1999 | Nakamura et al. |
| 5,990,542 A | 11/1999 | Yamazaki |
| 5,990,615 A | 11/1999 | Sakaguchi et al. |
| 5,990,629 A | 11/1999 | Yamada et al. |
| 5,998,805 A | 12/1999 | Shi et al. |
| 6,028,327 A | 2/2000 | Mizoguchi et al. |
| 6,046,543 A | 4/2000 | Bulovic et al. |
| 6,049,167 A | 4/2000 | Onitsuka et al. |
| 6,084,579 A | 7/2000 | Hirano |
| 6,111,361 A | 8/2000 | Xu et al. |
| 6,114,715 A | 9/2000 | Hamada |
| 6,118,212 A | 9/2000 | Nakaya et al. |
| 6,121,542 A | 9/2000 | Shiotsuka et al. |
| 6,121,726 A | 9/2000 | Codama et al. |
| 6,127,199 A | 10/2000 | Inoue et al. |
| 6,132,280 A | 10/2000 | Tanabe et al. |
| 6,144,108 A | 11/2000 | Ohizumi et al. |
| 6,146,225 A | 11/2000 | Sheats et al. |
| 6,150,187 A | 11/2000 | Zyung et al. |
| 6,150,668 A | 11/2000 | Bao et al. |
| 6,160,346 A | 12/2000 | Vleggaar et al. |
| 6,165,916 A * | 12/2000 | Muraoka et al. ............. 438/791 |
| 6,169,293 B1 | 1/2001 | Yamazaki |
| 6,169,304 B1 * | 1/2001 | Arita et al. .................... 257/295 |
| 6,172,459 B1 | 1/2001 | Hung et al. |
| 6,195,142 B1 | 2/2001 | Gyotoku et al. |
| 6,197,663 B1 | 3/2001 | Chandross et al. |
| 6,198,217 B1 | 3/2001 | Suzuki et al. |
| 6,198,220 B1 | 3/2001 | Jones et al. |
| 6,201,585 B1 | 3/2001 | Takano et al. |
| 6,214,631 B1 | 4/2001 | Burrows et al. |
| 6,239,470 B1 | 5/2001 | Yamazaki |
| 6,268,631 B1 | 7/2001 | Fukada et al. |
| 6,268,695 B1 | 7/2001 | Affinito |
| 6,270,944 B1 | 8/2001 | Wolk et al. |
| 6,274,412 B1 | 8/2001 | Kydd et al. |
| 6,274,887 B1 | 8/2001 | Yamazaki et al. |
| 6,287,955 B1 | 9/2001 | Wang et al. |
| 6,300,998 B1 | 10/2001 | Aruga |
| 6,303,963 B1 | 10/2001 | Ohtani et al. |
| 6,323,924 B1 | 11/2001 | Matsuoka et al. |
| 6,329,087 B1 | 12/2001 | Okamoto |
| 6,342,412 B1 | 1/2002 | Sugiura et al. |
| 6,343,171 B1 | 1/2002 | Yoshimura et al. |
| 6,351,078 B1 * | 2/2002 | Wang et al. ................. 315/169.3 |
| 6,372,608 B1 | 4/2002 | Shimoda et al. |
| 6,376,105 B1 | 4/2002 | Jonas et al. |
| 6,376,333 B1 | 4/2002 | Yamazaki et al. |
| 6,380,558 B1 | 4/2002 | Yamazaki et al. |
| 6,384,339 B1 | 5/2002 | Neuman |
| 6,392,143 B1 | 5/2002 | Koshio |
| 6,413,645 B1 | 7/2002 | Graff et al. |
| 6,420,988 B1 | 7/2002 | Azami et al. |
| 6,432,516 B1 | 8/2002 | Terasaki et al. |
| 6,441,468 B1 | 8/2002 | Yamazaki |
| 6,445,059 B1 | 9/2002 | Yamazaki |
| 6,448,710 B1 | 9/2002 | Asai et al. |
| 6,475,845 B2 | 11/2002 | Kimura |
| 6,480,255 B2 | 11/2002 | Hoshino et al. |
| 6,497,598 B2 | 12/2002 | Affinito |
| 6,501,227 B1 | 12/2002 | Koyama |
| 6,515,310 B2 | 2/2003 | Yamazaki et al. |
| 6,515,428 B1 * | 2/2003 | Yeh et al. .................... 315/169.3 |
| 6,522,066 B2 * | 2/2003 | Sheu et al. .................... 313/505 |
| 6,522,067 B1 | 2/2003 | Graff et al. |
| 6,525,339 B2 | 2/2003 | Motomatsu |
| 6,533,631 B2 | 3/2003 | Suzuki et al. |
| 6,538,374 B2 | 3/2003 | Hosokawa |
| 6,541,294 B1 | 4/2003 | Yamazaki et al. |
| 6,545,320 B2 * | 4/2003 | Ohtani et al. .................. 257/350 |
| 6,548,912 B1 | 4/2003 | Graff et al. |
| 6,559,594 B2 | 5/2003 | Fukunaga et al. |
| 6,570,325 B2 | 5/2003 | Graff et al. |
| 6,573,195 B1 * | 6/2003 | Yamazaki et al. ............. 438/783 |
| 6,573,652 B1 | 6/2003 | Graff et al. |
| 6,582,876 B2 | 6/2003 | Wolk et al. |
| 6,583,440 B2 * | 6/2003 | Yasukawa ....................... 257/59 |
| 6,586,772 B2 | 7/2003 | Bijlsma |

(56) References Cited

U.S. PATENT DOCUMENTS

| | | | | |
|---|---|---|---|---|
| 6,599,783 | B2 | 7/2003 | Takatoku | |
| 6,605,826 | B2 | 8/2003 | Yamazaki et al. | |
| 6,606,080 | B2 | 8/2003 | Mukao | |
| 6,614,174 | B1* | 9/2003 | Urabe et al. | 313/504 |
| 6,617,052 | B2 | 9/2003 | Morii | |
| 6,623,861 | B2 | 9/2003 | Martin et al. | |
| 6,624,568 | B2 | 9/2003 | Silvernail | |
| 6,624,839 | B2* | 9/2003 | Gaudiana et al. | 347/238 |
| 6,627,518 | B1 | 9/2003 | Inoue et al. | |
| 6,638,645 | B2 | 10/2003 | Sawai et al. | |
| 6,639,360 | B2 | 10/2003 | Roberts et al. | |
| 6,653,657 | B2 | 11/2003 | Kawasaki et al. | |
| 6,660,409 | B1 | 12/2003 | Komatsu et al. | |
| 6,664,732 | B2 | 12/2003 | Yamazaki et al. | |
| 6,674,136 | B1 | 1/2004 | Ohtani | |
| 6,680,577 | B1 | 1/2004 | Inukai et al. | |
| 6,689,492 | B1 | 2/2004 | Yamazaki et al. | |
| 6,692,845 | B2 | 2/2004 | Maruyama et al. | |
| 6,700,631 | B1 | 3/2004 | Inoue et al. | |
| 6,710,542 | B2 | 3/2004 | Chun et al. | |
| 6,720,203 | B2 | 4/2004 | Carcia et al. | |
| 6,728,278 | B2 | 4/2004 | Kahen et al. | |
| 6,730,966 | B2 | 5/2004 | Koyama | |
| 6,731,064 | B2* | 5/2004 | Andry et al. | 313/506 |
| 6,734,535 | B1 | 5/2004 | Hashimoto | |
| 6,737,753 | B2 | 5/2004 | Kumar et al. | |
| 6,738,034 | B2 | 5/2004 | Kaneko et al. | |
| 6,739,931 | B2 | 5/2004 | Yamazaki et al. | |
| 6,747,638 | B2 | 6/2004 | Yamazaki et al. | |
| 6,768,260 | B2 | 7/2004 | Fukunaga et al. | |
| 6,771,677 | B2 | 8/2004 | Furukawa et al. | |
| 6,774,975 | B2 | 8/2004 | Ahn | |
| 6,776,880 | B1 | 8/2004 | Yamazaki | |
| 6,777,621 | B2 | 8/2004 | Ishikawa et al. | |
| 6,777,710 | B1* | 8/2004 | Koyama | 257/59 |
| 6,781,152 | B2 | 8/2004 | Yamazaki | |
| 6,781,746 | B2* | 8/2004 | Yamazaki et al. | 359/321 |
| 6,792,333 | B2 | 9/2004 | Yamazaki | |
| 6,801,237 | B2* | 10/2004 | Gaudiana et al. | 347/238 |
| 6,803,127 | B2 | 10/2004 | Su et al. | |
| 6,806,638 | B2 | 10/2004 | Lih et al. | |
| 6,819,044 | B2 | 11/2004 | Shirakawa et al. | |
| 6,822,264 | B2 | 11/2004 | Yamazaki et al. | |
| 6,825,496 | B2 | 11/2004 | Yamazaki et al. | |
| 6,828,727 | B2 | 12/2004 | Yamazaki | |
| 6,830,494 | B1 | 12/2004 | Yamazaki et al. | |
| 6,831,298 | B2 | 12/2004 | Park et al. | |
| 6,833,668 | B1 | 12/2004 | Yamada et al. | |
| 6,835,950 | B2 | 12/2004 | Brown et al. | |
| 6,849,877 | B2 | 2/2005 | Yamazaki et al. | |
| 6,852,997 | B2 | 2/2005 | Yamazaki et al. | |
| 6,866,901 | B2 | 3/2005 | Burrows et al. | |
| 6,869,635 | B2 | 3/2005 | Kobayashi | |
| 6,872,604 | B2* | 3/2005 | Yamazaki et al. | 438/151 |
| 6,885,389 | B2 | 4/2005 | Inoue et al. | |
| 6,894,431 | B2 | 5/2005 | Yamazaki et al. | |
| 6,897,608 | B2 | 5/2005 | Yamazaki et al. | |
| 6,909,114 | B1 | 6/2005 | Yamazaki | |
| 6,911,772 | B2 | 6/2005 | Cok | |
| 6,923,702 | B2 | 8/2005 | Graff et al. | |
| 6,924,594 | B2 | 8/2005 | Ogura et al. | |
| 6,933,672 | B2 | 8/2005 | Hosokawa | |
| 6,936,846 | B2 | 8/2005 | Koyama et al. | |
| 6,940,223 | B2 | 9/2005 | Yamazaki | |
| 6,955,578 | B2 | 10/2005 | Park et al. | |
| 6,962,671 | B2 | 11/2005 | Martin et al. | |
| 6,963,168 | B2 | 11/2005 | Eida et al. | |
| 6,965,195 | B2 | 11/2005 | Yamazaki et al. | |
| 6,977,463 | B2* | 12/2005 | Sato | 313/498 |
| 6,982,462 | B2 | 1/2006 | Koyama | |
| 6,995,511 | B2 | 2/2006 | Yamazaki et al. | |
| 7,005,798 | B2 | 2/2006 | Carcia et al. | |
| 7,012,367 | B2 | 3/2006 | Seki | |
| 7,027,023 | B2* | 4/2006 | Okishiro et al. | 345/94 |
| 7,034,456 | B2 | 4/2006 | Yamazaki et al. | |
| 7,045,822 | B2 | 5/2006 | Tsuchiya | |
| 7,060,153 | B2 | 6/2006 | Yamazaki et al. | |
| 7,061,186 | B2* | 6/2006 | Inukai et al. | 315/169.3 |
| 7,101,242 | B2 | 9/2006 | Fukunaga et al. | |
| 7,119,364 | B2 | 10/2006 | Yamazaki | |
| 7,147,530 | B2 | 12/2006 | Yamazaki et al. | |
| 7,148,630 | B2 | 12/2006 | Koyama et al. | |
| 7,172,928 | B2 | 2/2007 | Yamazaki | |
| 7,187,121 | B2 | 3/2007 | Hasegawa et al. | |
| 7,198,832 | B2 | 4/2007 | Burrows et al. | |
| 7,202,504 | B2 | 4/2007 | Ikeda et al. | |
| 7,211,828 | B2 | 5/2007 | Yamazaki et al. | |
| 7,214,555 | B2 | 5/2007 | Yamazaki et al. | |
| 7,230,271 | B2 | 6/2007 | Yamazaki et al. | |
| 7,239,083 | B2* | 7/2007 | Koyama | 313/506 |
| 7,250,718 | B2 | 7/2007 | Hosokawa | |
| 7,271,858 | B2 | 9/2007 | Yamazaki et al. | |
| 7,288,420 | B1 | 10/2007 | Yamazaki et al. | |
| 7,301,277 | B2 | 11/2007 | Hayashi et al. | |
| 7,332,859 | B2 | 2/2008 | Hasegawa et al. | |
| 7,393,707 | B2 | 7/2008 | Yamazaki et al. | |
| 7,422,934 | B2* | 9/2008 | Yamazaki et al. | 438/151 |
| 7,427,832 | B2 | 9/2008 | Kobayashi | |
| 7,439,543 | B2 | 10/2008 | Yamazaki | |
| 7,459,849 | B2 | 12/2008 | Yamazaki et al. | |
| 7,462,501 | B2 | 12/2008 | Yamazaki et al. | |
| 7,488,985 | B2 | 2/2009 | Tsuchiya | |
| 7,503,975 | B2* | 3/2009 | Yamazaki et al. | 117/4 |
| 7,514,868 | B2 | 4/2009 | Yamazaki et al. | |
| 7,525,119 | B2 | 4/2009 | Koyama | |
| 7,525,165 | B2* | 4/2009 | Yamazaki et al. | 257/408 |
| 7,572,478 | B2 | 8/2009 | Ogura et al. | |
| 7,579,203 | B2* | 8/2009 | Yamazaki et al. | 438/35 |
| 7,683,535 | B2 | 3/2010 | Fukunaga et al. | |
| 7,692,378 | B2 | 4/2010 | Yamazaki | |
| 7,696,524 | B2 | 4/2010 | Ikeda et al. | |
| 7,728,326 | B2 | 6/2010 | Yamazaki et al. | |
| 7,732,824 | B2* | 6/2010 | Konuma et al. | 257/83 |
| 7,745,991 | B2 | 6/2010 | Yamazaki et al. | |
| 7,745,993 | B2 | 6/2010 | Fukunaga et al. | |
| 7,825,588 | B2 | 11/2010 | Yamazaki et al. | |
| 7,867,053 | B2 | 1/2011 | Fukunaga et al. | |
| 7,880,167 | B2 | 2/2011 | Yamazaki et al. | |
| 7,932,667 | B2 | 4/2011 | Tsuchiya | |
| 7,952,101 | B2 | 5/2011 | Yamazaki et al. | |
| 7,994,705 | B2 | 8/2011 | Hosokawa | |
| 8,017,945 | B2* | 9/2011 | Yamazaki et al. | 257/59 |
| 8,039,288 | B2 | 10/2011 | Yamazaki | |
| 8,203,265 | B2 | 6/2012 | Yamazaki et al. | |
| 8,358,063 | B2 | 1/2013 | Yamazaki | |
| 8,390,190 | B2* | 3/2013 | Koyama | 313/504 |
| 8,415,660 | B2 | 4/2013 | Yamazaki et al. | |
| 8,421,350 | B2 | 4/2013 | Yamazaki et al. | |
| 8,466,482 | B2 | 6/2013 | Yamazaki | |
| 8,546,825 | B2* | 10/2013 | Yamazaki et al. | 257/89 |
| 8,674,600 | B2 | 3/2014 | Yamazaki et al. | |
| 8,987,988 | B2 | 3/2015 | Yamazaki et al. | |
| 2001/0001485 | A1 | 5/2001 | Bao et al. | |
| 2001/0002703 | A1 | 6/2001 | Koyama | |
| 2001/0011726 | A1 | 8/2001 | Hayashi et al. | |
| 2001/0015618 | A1 | 8/2001 | Yamazaki et al. | |
| 2001/0019133 | A1 | 9/2001 | Konuma et al. | |
| 2001/0026835 | A1 | 10/2001 | Tanaka | |
| 2001/0030323 | A1 | 10/2001 | Ikeda | |
| 2001/0034075 | A1 | 10/2001 | Onoya | |
| 2001/0034088 | A1 | 10/2001 | Nakamura et al. | |
| 2001/0035528 | A1 | 11/2001 | Yang et al. | |
| 2001/0035863 | A1 | 11/2001 | Kimura | |
| 2001/0036733 | A1 | 11/2001 | Luo et al. | |
| 2001/0038127 | A1 | 11/2001 | Yamazaki et al. | |
| 2001/0038367 | A1 | 11/2001 | Inukai | |
| 2001/0040645 | A1 | 11/2001 | Yamazaki | |
| 2001/0041270 | A1 | 11/2001 | Maruyama et al. | |
| 2001/0043168 | A1 | 11/2001 | Koyama et al. | |
| 2001/0045560 | A1 | 11/2001 | Bijlsma | |
| 2001/0045565 | A1 | 11/2001 | Yamazaki | |
| 2001/0048106 | A1 | 12/2001 | Tanada | |
| 2001/0048110 | A1 | 12/2001 | Hiroki | |
| 2001/0055008 | A1 | 12/2001 | Young et al. | |

(56) References Cited

U.S. PATENT DOCUMENTS

| | | | |
|---|---|---|---|
| 2002/0017643 A1 | 2/2002 | Koyama | |
| 2002/0018176 A1 | 2/2002 | Kobayashi et al. | |
| 2002/0030193 A1 | 3/2002 | Yamazaki et al. | |
| 2002/0043660 A1* | 4/2002 | Yamazaki et al. | 257/59 |
| 2002/0047120 A1* | 4/2002 | Inukai | 257/59 |
| 2002/0063253 A1 | 5/2002 | Hong et al. | |
| 2002/0084464 A1 | 7/2002 | Yamazaki et al. | |
| 2002/0125817 A1 | 9/2002 | Yamazaki et al. | |
| 2002/0125822 A1 | 9/2002 | Graff et al. | |
| 2002/0126235 A1* | 9/2002 | Deane | 349/44 |
| 2002/0153829 A1 | 10/2002 | Asai et al. | |
| 2002/0158568 A1* | 10/2002 | Satake | 313/493 |
| 2003/0027369 A1 | 2/2003 | Yamazaki | |
| 2003/0034497 A1 | 2/2003 | Yamazaki et al. | |
| 2003/0094615 A1 | 5/2003 | Yamazaki et al. | |
| 2003/0107326 A1 | 6/2003 | Park et al. | |
| 2003/0116768 A1 | 6/2003 | Ishikawa | |
| 2003/0117066 A1 | 6/2003 | Silvernail | |
| 2003/0146439 A1 | 8/2003 | Yamazaki et al. | |
| 2003/0146695 A1 | 8/2003 | Seki | |
| 2003/0155573 A1 | 8/2003 | Yamazaki et al. | |
| 2003/0206332 A1* | 11/2003 | Yamazaki et al. | 359/312 |
| 2003/0211667 A1 | 11/2003 | Takatoku | |
| 2003/0211668 A1 | 11/2003 | Takatoku | |
| 2003/0230972 A1 | 12/2003 | Cok | |
| 2004/0228569 A1 | 11/2004 | Yamazaki | |
| 2005/0001215 A1* | 1/2005 | Koyama | 257/59 |
| 2005/0093436 A1 | 5/2005 | Yamazaki | |
| 2005/0098113 A1 | 5/2005 | Hayashi | |
| 2005/0176181 A1 | 8/2005 | Burrows et al. | |
| 2005/0263775 A1 | 12/2005 | Ikeda et al. | |
| 2005/0264182 A1 | 12/2005 | Seki | |
| 2005/0269578 A1 | 12/2005 | Barnes et al. | |
| 2005/0275346 A1 | 12/2005 | Eida et al. | |
| 2006/0051906 A1 | 3/2006 | Yamazaki | |
| 2006/0141645 A1 | 6/2006 | Yamazaki et al. | |
| 2007/0096641 A1 | 5/2007 | Hasegawa et al. | |
| 2007/0164295 A1 | 7/2007 | Yamazaki et al. | |
| 2007/0164376 A1 | 7/2007 | Burrows et al. | |
| 2007/0181912 A1 | 8/2007 | Ikeda et al. | |
| 2007/0196682 A1 | 8/2007 | Visser et al. | |
| 2007/0210459 A1 | 9/2007 | Burrows et al. | |
| 2008/0042562 A1 | 2/2008 | Hayashi | |
| 2008/0258617 A1 | 10/2008 | Kobayashi | |
| 2010/0148204 A1 | 6/2010 | Ikeda et al. | |
| 2010/0163859 A1 | 7/2010 | Yamazaki et al. | |
| 2011/0101852 A1 | 5/2011 | Fukunaga et al. | |
| 2011/0108863 A1 | 5/2011 | Yamazaki et al. | |
| 2011/0156580 A1* | 6/2011 | Yamazaki | 313/506 |
| 2011/0260167 A1 | 10/2011 | Hosokawa | |
| 2011/0278572 A1* | 11/2011 | Koyama | 257/57 |
| 2012/0080669 A1 | 4/2012 | Yamazaki et al. | |
| 2012/0248454 A1* | 10/2012 | Yamazaki | 257/72 |
| 2013/0277679 A1 | 10/2013 | Yamazaki | |
| 2014/0183540 A1* | 7/2014 | Koyama et al. | 257/72 |
| 2015/0049279 A1 | 2/2015 | Yamazaki | |

FOREIGN PATENT DOCUMENTS

| | | |
|---|---|---|
| EP | 1 003 223 A2 | 5/2000 |
| EP | 1 014 452 | 6/2000 |
| EP | 1058314 A | 12/2000 |
| EP | 1058484 A | 12/2000 |
| EP | 1 686 626 | 8/2006 |
| EP | 2 259 292 A2 | 12/2010 |
| JP | 62-005597 A | 1/1987 |
| JP | 64-059791 | 3/1989 |
| JP | 03-062497 | 3/1991 |
| JP | 04-014440 | 1/1992 |
| JP | 05-315630 | 11/1993 |
| JP | 06-013180 | 1/1994 |
| JP | 07-065950 | 3/1995 |
| JP | 07-192866 A | 7/1995 |
| JP | 08-068990 | 3/1996 |
| JP | 08-111516 | 4/1996 |
| JP | 08-124677 | 5/1996 |
| JP | 08-255916 | 10/1996 |
| JP | 08-262474 | 10/1996 |
| JP | 08-288522 | 11/1996 |
| JP | 08-288522 A | 11/1996 |
| JP | 08-318590 | 12/1996 |
| JP | 09-033933 A | 2/1997 |
| JP | 09-082476 | 3/1997 |
| JP | 09-161967 | 6/1997 |
| JP | 09-260059 | 10/1997 |
| JP | 10-125929 | 5/1998 |
| JP | 10-125931 | 5/1998 |
| JP | 10-312883 | 11/1998 |
| JP | 11-218777 A | 8/1999 |
| JP | 11-243209 | 9/1999 |
| JP | 11-251517 | 9/1999 |
| JP | 11-312811 | 11/1999 |
| JP | 11-329719 A | 11/1999 |
| JP | 2000-048951 A | 2/2000 |
| JP | 2000-058256 A | 2/2000 |
| JP | 2000-068050 A | 3/2000 |
| JP | 2000-100577 | 4/2000 |
| JP | 2000-133450 | 5/2000 |
| JP | 2000-173027 | 6/2000 |
| JP | 2000-323173 | 11/2000 |
| JP | 2000-323273 | 11/2000 |
| JP | 2000-323276 | 11/2000 |
| JP | 2000-357585 | 12/2000 |
| JP | 2000-357735 A | 12/2000 |
| JP | 2001-009963 | 1/2001 |
| JP | 2001-051296 | 2/2001 |
| JP | 2001-052864 A | 2/2001 |
| JP | 2001-052873 A | 2/2001 |
| JP | 2001-057286 | 2/2001 |
| JP | 2001-085156 | 3/2001 |
| JP | 2001-094113 | 4/2001 |
| JP | 2001-118674 | 4/2001 |
| JP | 2001-185346 A | 7/2001 |
| JP | 2001-185354 | 7/2001 |
| JP | 2001-189460 A | 7/2001 |
| JP | 2001-230086 A | 8/2001 |
| JP | 1122794 A | 8/2001 |
| JP | 2001-249627 A | 9/2001 |
| JP | 2001-272923 | 10/2001 |
| JP | 2001-282123 A | 10/2001 |
| JP | 2001-326071 A | 11/2001 |
| JP | 2001-357973 A | 12/2001 |
| JP | 2002-082633 | 3/2002 |
| JP | 1191820 A | 3/2002 |
| JP | 2002-117973 A | 4/2002 |
| JP | 2002-134270 A | 5/2002 |
| JP | 2002-532850 | 10/2002 |
| JP | 2002-543563 | 12/2002 |
| JP | 2003-017244 A | 1/2003 |
| JP | 2003-086356 | 3/2003 |
| JP | 2003-100450 | 4/2003 |
| JP | 2003-203771 A | 7/2003 |
| JP | 2003-532260 | 10/2003 |
| JP | 2003-533892 | 11/2003 |
| JP | 2261978 A | 12/2010 |
| JP | 2262349 A | 12/2010 |
| JP | 2296443 A | 3/2011 |
| KR | 2001-0006343 A | 1/2001 |
| WO | WO-00/36665 | 6/2000 |
| WO | WO-00/65670 | 11/2000 |

OTHER PUBLICATIONS

Notice of Preliminary Rejection, Office Action in Korean Patent Application No. 2002-0034626; KR5800) dated Jan. 20, 2009, with English translation.

Office Action (Japanese Patent Application No. 2002-176571), dated Feb. 12, 2008.

Tsutsui et al., "High Quantum Efficiency in Organic Light-Emitting Devices with Iridium-Complex as a Triplet Emissive Center", Japanese Journal of Applied Physics, vol. 38/Part 2, No. 12B, Dec. 15, 1999, pp. L1502-L1504.

(56) References Cited

OTHER PUBLICATIONS

Tsutsui et al., "Electroluminescence in Organic Thin Films", Photochemical Processes in Organized Molecular Systems, 1991, pp. 437-450.

M. A. Baldo et al., "Highly Efficient Phosphorescent Emission from Organic Electroluminescent Devices", Nature vol. 395, Sep. 10, 1998, pp. 151-154.

M. A. Baldo et al., "Very High-Efficiency Green Organic Light-Emitting Devices Based on Electrophosphorescence", Applied Physics Letters vol. 75, No. 1, Jul. 5, 1999, pp. 4-6.

A.G. Erlat et al., "Characterisation of aluminium oxynitride gas barrier films," Thin Solid Films (2001), pp. 78-86, vol. 388, No. 1-2.

SRO Pellet-Developed by Toshima MFG CO., Which Is Attracted Attention in PDP and Organic ELD, Is Applicable to Material for Protective film in PDP and Material for Absorbent Film in Orgnic ELD, Seminconductor FPD World, Mar. 1, 2002, vol. 21, No. 3, pp. 85-87.

Tsuruoka. Y et al., "Transparent Thin Film Desiccant for OLEDS,", SID Digest '03; SID International Symposium Digest of Technical Papers, 2003, vol. 34, pp. 860-863.

Notification of Reason(s) for Refusal (Japanese patent application No. 2013-014541) Dated Jan. 28, 2014.

\* cited by examiner

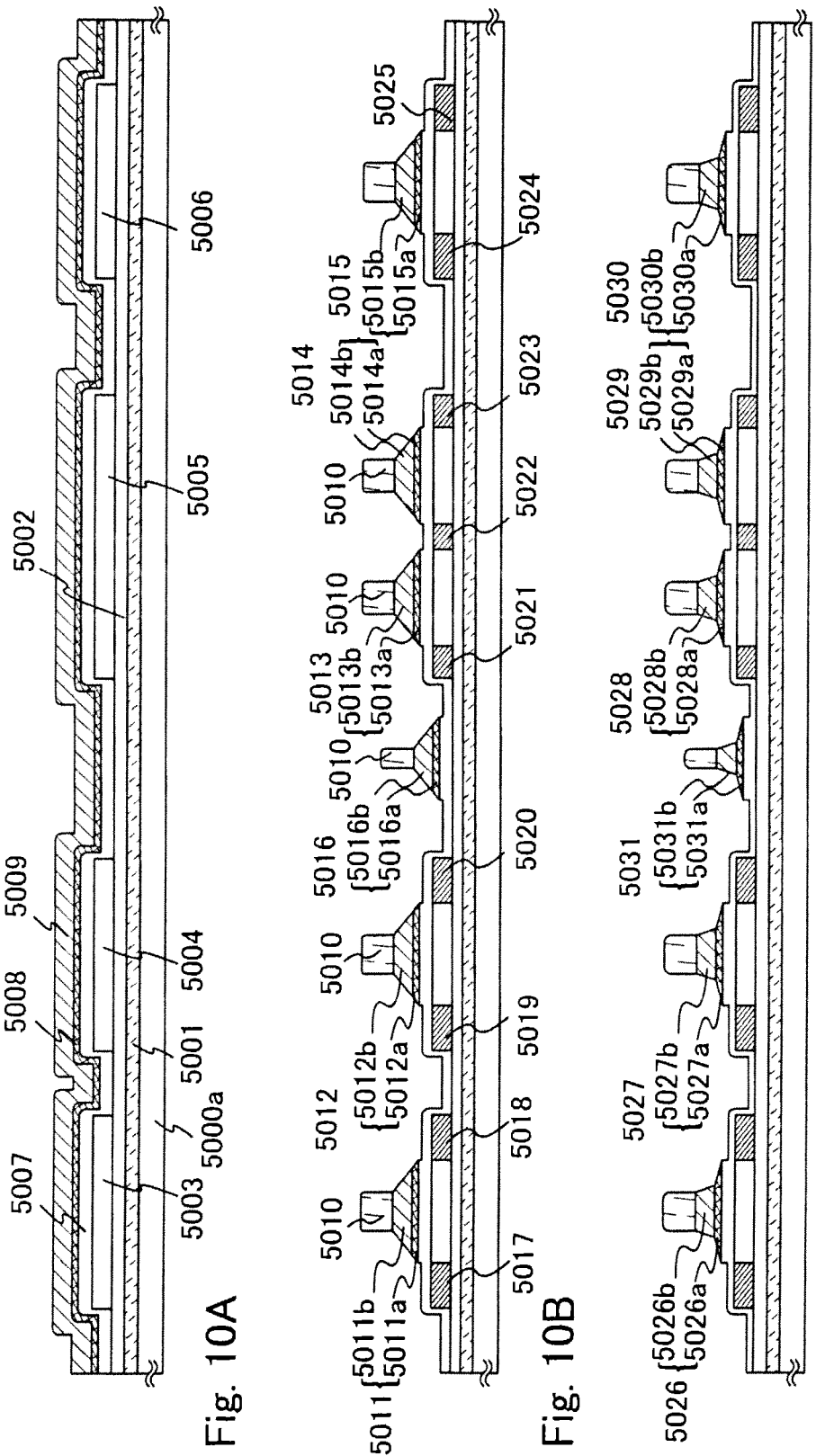

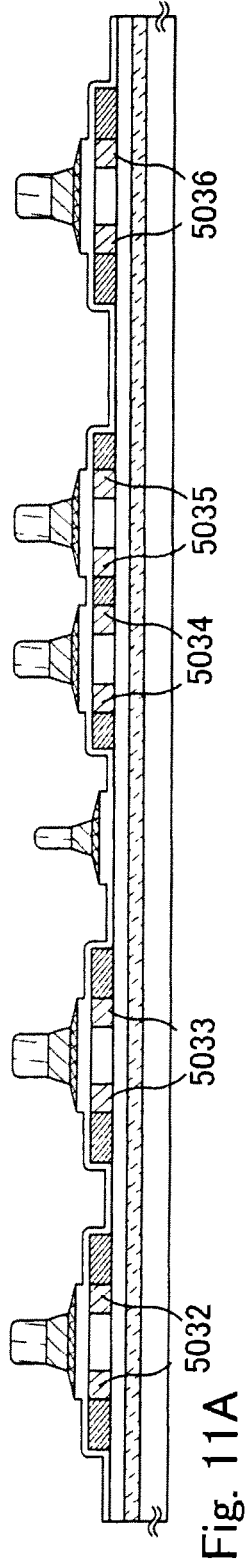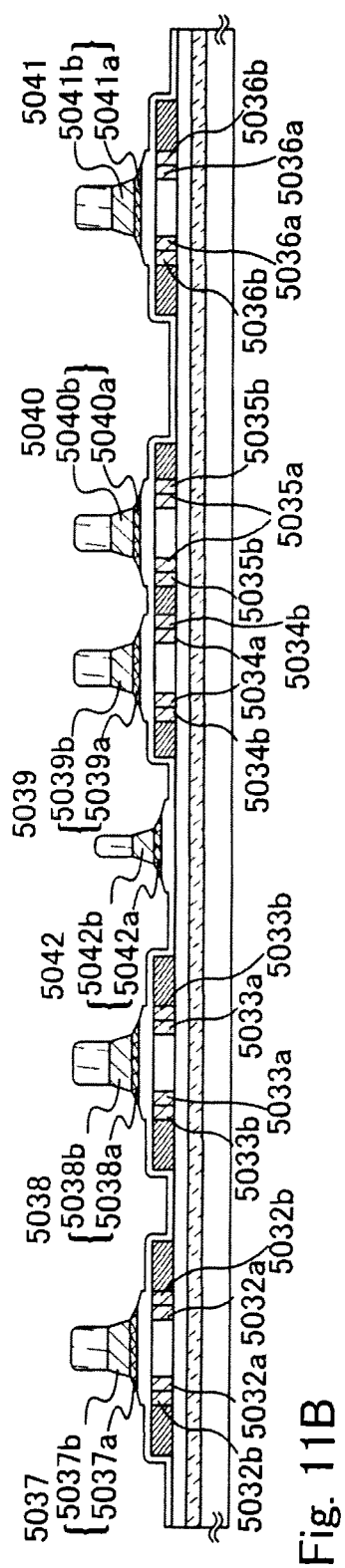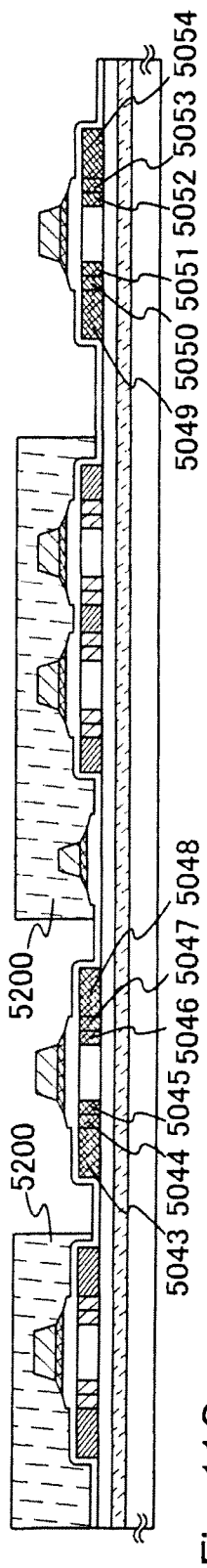

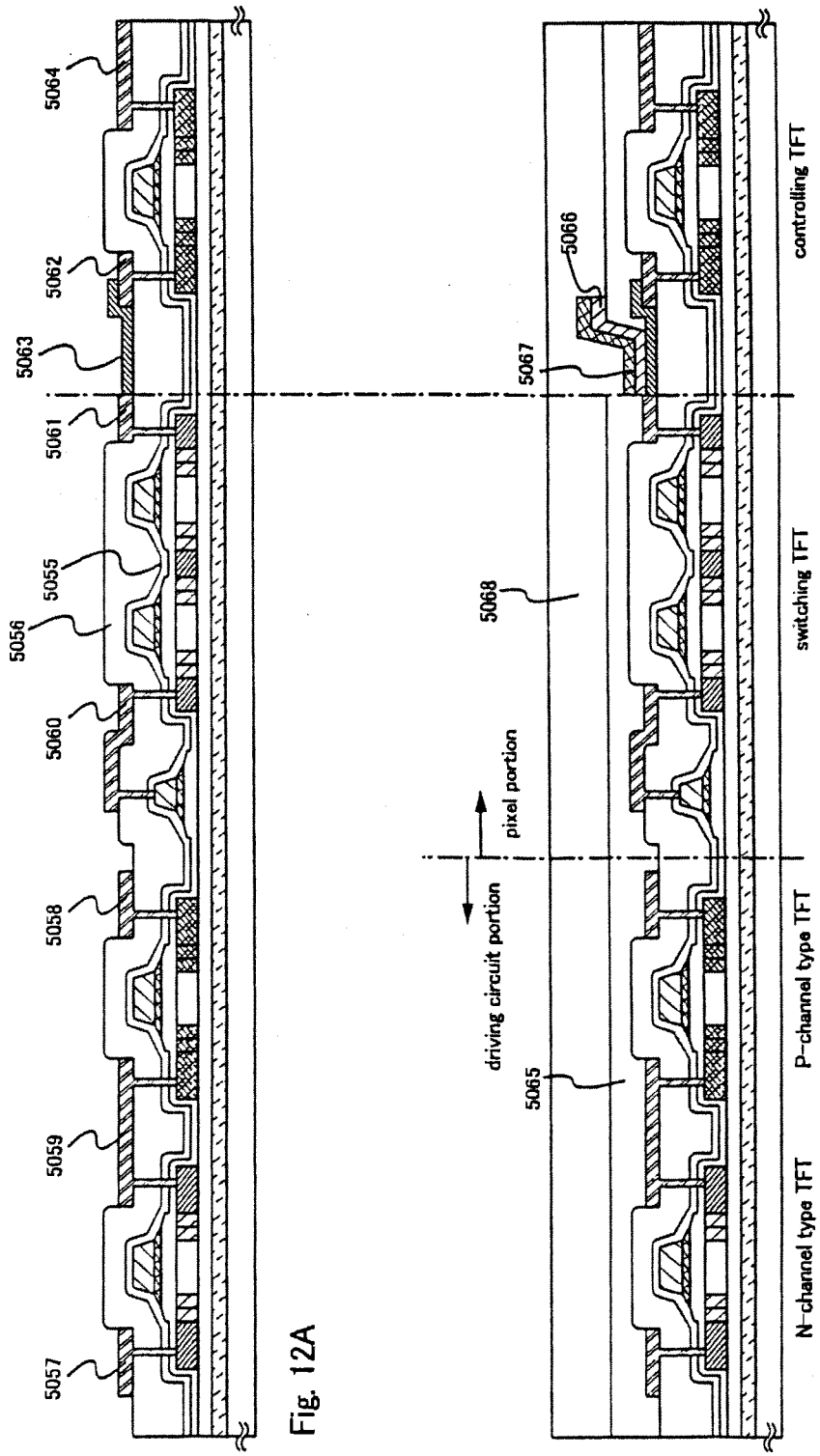

LIGHT EMITTING DEVICE HAVING AN ORGANIC LIGHT EMITTING DIODE THAT EMITS WHITE LIGHT

BACKGROUND OF THE INVENTION

1. Field of the Invention

The present invention relates to a method of manufacturing a semiconductor device, more specifically, to a light emitting device including a light emitting element, for example, an organic light emitting diode (OLED), formed on a plastic substrate. The present invention also relates to an OLED module in which an IC including a controller and the like is mounted onto an OLED panel. Throughout the specification, OLED panels and OLED modules are generically referred to as light emitting devices. The present invention further relates to an electrical appliance using the light emitting device.

2. Description of the Related Art

Recently, a technique for forming a TFT (thin film transistor) on a substrate has been remarkably developed, and continues to be further developed for its application to active matrix display devices. Particularly, a TFT using a polysilicon film can operate at a high speed because such a TFT has a higher field effect mobility than a TFT using a conventional amorphous silicon film. Therefore, the control of pixels, which has been conventionally performed by a driver circuit provided outside a substrate, can be now performed by a driver circuit provided on the same substrate on which the pixels are formed.

Such an active matrix display device includes various circuits or elements formed on the same substrate. Owing to this structure, the active matrix display device provides various advantages such as reduced manufacturing cost, reduced size of a display device, an increased yield, and an increased throughput.

Furthermore, an active matrix light emitting device including an OLED as a self-luminous element (hereinafter, simply referred to as a light emitting device) has been actively studied. The light emitting device is also called an organic EL display (OELD) or an organic light emitting diode.

The OLED is optimal for reduction in thickness of a light emitting device because it has a high visibility for its self-luminescence and thus it does not require a backlight which is necessary for a liquid crystal display (LCD). Moreover, the OLED is further advantageous in its unlimited viewing angle. For these advantages, light emitting devices using the OLED attract attention as display devices replacing CRTs or LCDs.

The OLED includes a layer containing an organic compound (organic light emitting material; such a layer is referred to as an organic light emitting layer, hereinafter), an anode layer and a cathode layer. The organic light emitting layer generates luminescence (electroluminescence) by applying an electric field across the anode and the to cathode. The electroluminescence generated from the organic compound includes: light emission (fluorescence) caused upon return from a singlet excited state to a ground state; and light emission (phosphorescence) caused upon return from a triplet excited state to a ground state. The light emitting device of the present invention may use either one of the above-described types of light emission; alternatively, it may use both types of light emission.

In this specification, all layers provided between a cathode and an anode of an OLED are generically defined as organic light emitting layers. Specifically, a light emitting layer, a hole injection layer, an electron injection layer, a hole transporting layer, an electron transporting layer and the like are all included in the category of organic light emitting layers. The OLED basically has a structure in which an anode, a light emitting layer and a cathode are layered in this order. In addition to this structure, some OLEDs have a structure including an anode, a hole injection layer, a light emitting layer and a cathode layered in this order, and other OLEDs have a structure including an anode, a hole injection layer, a light emitting layer, an electron transporting layer, a cathode and the like layered in this order.

Such a light emitting device is expected to be used for various applications. In particular, the light emitting device is desired to be applied to portable equipment for its small thickness and thus the possibility of reduction in weight. For this propose, an attempt has been made to form an OLED on a flexible plastic film.

A light emitting device, in which an OLED is formed on a flexible substrate such as a plastic film, is advantageous not only in its small thickness and light weight but also its utility for a display having a curved surface, a show window and the like. Therefore, its application range is extremely wide, not limited to portable equipment.

However, a substrate made of plastic is generally likely to allow moisture or oxygen to pass through. Since the degradation of an organic light emitting layer is accelerated by moisture and oxygen, the lifetime of a light emitting device tends to be short by the penetration of moisture or oxygen. As a conventional solution of this problem, an insulating film such as a silicon nitride film or a silicon oxynitride film is provided between the plastic substrate and the OLED so as to prevent moisture or oxygen from to penetrating into the organic light emitting layer.

In general, however, a substrate such as a plastic film is easily affected by heat. At an excessively elevated film formation temperature for an insulating film such as a silicon nitride film or a silicon oxynitride film, a substrate is likely to be deformed. On the contrary, at an excessively low film formation temperature, the quality of a film may be degraded, making it difficult to sufficiently prevent the penetration of moisture or oxygen.

Furthermore, if a thickness of an insulating film such as a silicon nitride film or a silicon oxynitride film is increased so as to prevent the penetration of moisture or oxygen, a stress is correspondingly increased to easily cause a crack in the film. Moreover, with an increase in thickness, a crack is likely to be generated in the insulating film when the substrate is bent.

SUMMARY OF THE INVENTION

In view of the above problems, the present invention has an object of providing a light emitting device including an OLED formed on a plastic substrate, which is capable of restraining the degradation due to penetration of moisture or oxygen.

According to the present invention, a plurality of films which prevent oxygen or moisture from penetrating into an organic light emitting layer of an OLED (hereinafter, referred to as barrier films) and a layer having a smaller stress than that of the barrier films (hereinafter, referred to as a stress relaxing film), being sandwiched between the barrier films, are provided on a plastic substrate. Throughout the specification, a film formed by a laminate of the barrier films and the stress relaxing film is referred to as a staling film.

Specifically, two or more barrier films made of an inorganic material (hereinafter, simply referred to as barrier films) are provided. Furthermore, a stress relaxing film containing a resin (hereinafter, simply referred to as a stress relaxing film) is provided between the barrier films. Then, an OLED is formed on these three or more layers of the insulating films. The OLED is sealed to complete a light emitting device.

According to the present invention, a plurality of barrier films are laminated. In this manner, even if a crack occurs in one of the barrier films, the other barrier film(s) can effectively prevent moisture or oxygen from penetrating into the organic light emitting layer. Moreover, even though the quality of barrier films is degraded due to a low film formation temperature, a laminate of a plurality of barrier films can effectively prevent moisture or oxygen from penetrating into the organic light emitting layer.

Furthermore, a stress relaxing film, which has a smaller stress than that of the barrier film, is sandwiched between the barrier films to reduce the entire stress of the sealing film. Thus, a crack due to stress hardly occurs in a multi-layered barrier film, in which a stress relaxing film is interposed between barrier films, as compared with a single-layered barrier film having the same thickness.

Accordingly, a multi-layered barrier film can effectively prevent moisture or oxygen from penetrating into the organic light emitting layer as compared with a single-layered barrier film having the same thickness. In addition, a crack due to stress hardly occurs in such a multi-layered barrier film.

Moreover, a laminate structure of barrier films and a stress relaxing film provides a further flexibility to a device, thereby preventing a crack upon bend of the substrate.

Furthermore, according to the present invention, a film for sealing an OLED formed on a substrate (hereinafter, referred to as a scaling film) may also have the above-mentioned multi-layered structure. With such a structure, moisture or oxygen can be effectively prevented from penetrating into the organic light emitting layer. In addition, a crack is prevented from occurring upon bend of the substrate. As a result, a light emitting device having enhanced flexibility can be realized.

BRIEF DESCRIPTION OF THE DRAWINGS

In the accompanying drawings:

FIGS. 5A to 8D are diagrams showing the manufacturing methods of a light emitting device according to the present invention;

FIGS. 10A to 10C are diagrams showing the steps of manufacturing a TFT and an OLED included in a light emitting device according to the present invention;

FIGS. 11A to 11C are diagrams showing the steps of manufacturing a TFT and an OLED included in the light emitting device according to the present invention;

FIGS. 12A and 12B are diagrams showing the steps of manufacturing a TFT and an OLED included in the light emitting device according to the present invention;

DESCRIPTION OF THE PREFERRED EMBODIMENTS

Hereinafter, embodiment modes of the present invention, will be described with reference to the accompanying drawings. FIGS. 1A through 4C are cross-sectional views showing the manufacturing steps in a pixel portion and a driving circuit.

Embodiment mode 1

Figures 1A, 1B, 1C:
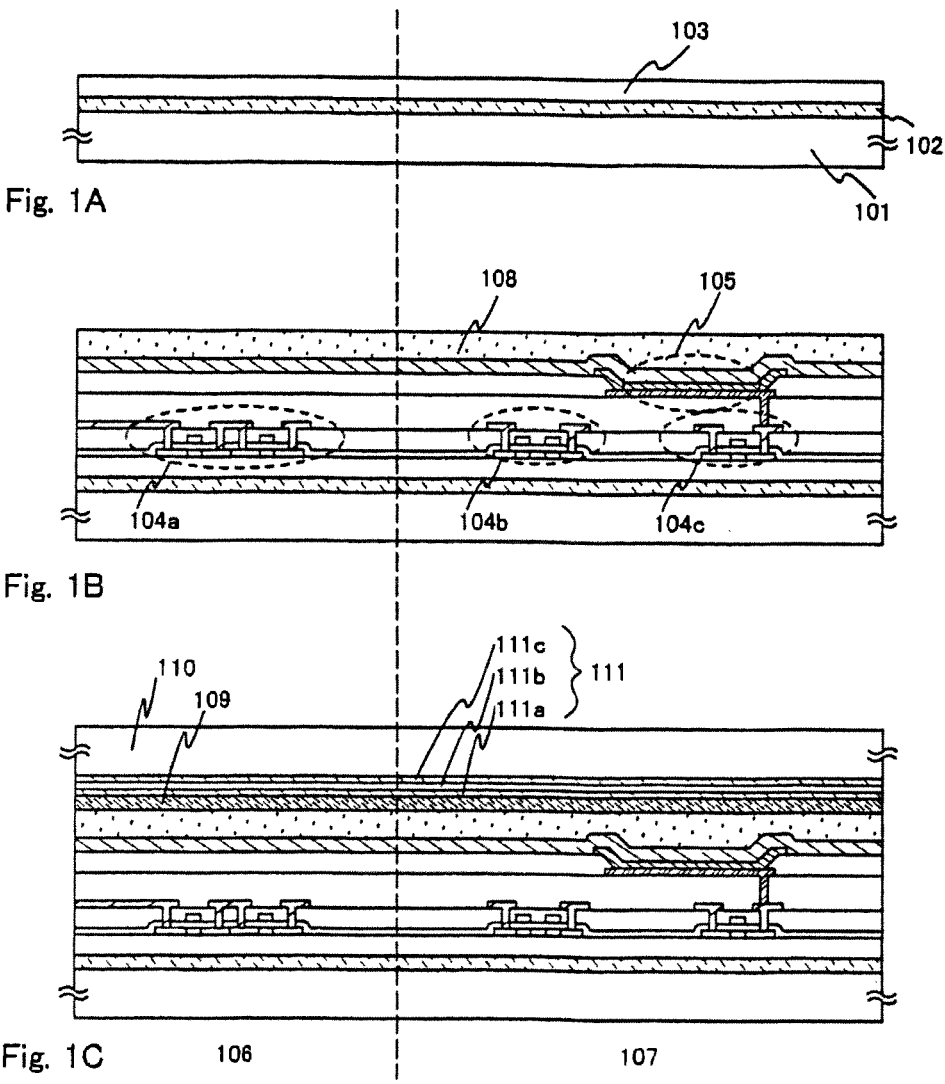
FIGS. 1A to 1C are diagrams showing the manufacturing methods of a light emitting device according to the present invention.

In FIG. 1A, a first bonding layer 102 made of an amorphous silicon film is formed to have a thickness of 100 to 500 nm (300 nm in this embodiment mode) on a first substrate 101. Although a glass substrate is used as the first substrate 101 in this embodiment mode, a quartz substrate, a silicon substrate, a metal substrate or a ceramic substrate may be alternatively used. Any material can be used for the first substrate 101 as long as it is resistant to a treatment temperature in the later manufacturing steps.

As a method of forming the first bonding layer 102, a low pressure thermal CVD method, a plasma CVD method, a sputtering method or an evaporation method may be used. On the first bonding layer 102, an insulating film 103 made of a silicon oxide film is formed to have a thickness of 200 nm. As a method of forming the insulating film 103, a low pressure thermal CVD method, a plasma CVD method, a sputtering method or an evaporation method may be used. The insulating film 103 serves to protect an element formed on the first substrate 101 when the first bonding layer 102 is removed to peel off the first substrate 101.

Next, an element is formed on the insulating film 103 (FIG. 1B). The element herein designates a semiconductor element (typically, a TFT) or an MIM element, which is used as a switching element for a pixel, an OLED and the like in the case of an active matrix light emitting device. In the case of a passive light emitting device, the element designates art OLED. In FIG. 1B, a TFT 104a in a driving circuit 106, TFTs 104b and 104c and an OLED 105 in a pixel portion are shown as representative elements.

Then, an insulating film 108 is formed so as to cover the above-described to elements. It is preferred that the insulating film 108 has a flatter surface after its formation. It is not necessarily required to provide the insulating film 108.

Next, as shown in FIG. 1C, a second substrate 110 is bonded to the first substrate 101 through a second bonding layer 109. In this embodiment mode, a plastic substrate is used as the second substrate 110. More specifically, a resin substrate having a thickness of 10 μm or more, for example, a substrate made of PES (polyether sulfone), PC (polycarbonate), PET (polyethylene terephthalate) or PEN (polyethylene naphthalate) can be used.

As a material of the second bonding layer 109, it is necessary to use such a material that can provide a high selection ratio when the first bonding layer 102 is to be removed in the later step. Typically, an insulating film made of a resin can be used as the second bonding layer 109. Although polyimide is used as a material of the second bonding layer 109 in this embodiment mode, acryl, polyamide or an epoxy resin can be alternatively used. In the case where the second bonding layer 109 is placed on the viewer side (the side of a light emitting device user) when seen from the OLED, a material is required to have light transmittance.

Furthermore, in this embodiment mode, two or more barrier films are formed on the second substrate 110. Then, a stress relaxing film is provided between the two barrier films. As a result, a sealing film having a laminate structure of the barrier films and the stress relaxing film is formed between the second substrate 110 and the second bonding layer 109.

For example, in this embodiment mode, a film made of silicon nitride is formed as a bather film 111a by sputtering on the second substrate 110; a stress relaxing film 111b containing polyimide is formed on the barrier film 111a; and a film made of silicon nitride is formed as a barrier film 111c by sputtering on the stress relaxing film 111b. A laminate film of the barrier film 111a, the stress relaxing film 111b and the barrier film 111c is collectively referred to as a sealing film 111. Then, the second substrate 110, on which the sealing film 111 is formed, is bonded to the element formed on the first substrate 101 through the second bonding layer 109.

It is sufficient to provide two or more barrier films. As a material of the barrier to films, silicon nitride, silicon oxynitride, aluminum oxide, aluminum nitride, aluminum oxynitride or aluminum suicide oxynitride (AlSiON) can be used.

Since aluminum silicide oxynitride has a relatively high thermal conductivity, its use for the bather films allows efficient radiation of heat that is generated in the element.

A resin having light transmittance can be used for the stress relaxing film 111b. Typically, polyimide, acryl, polyamide, polyimide amide, benzocyclobutene, an epoxy resin or the like can be used. Resins other than the above-described resins can also be used. In this embodiment mode, the stress relaxing film is formed by application of thermally polymerizable polyimide, followed by baking.

A silicon nitride film is formed by introducing argon at a substrate temperature kept at 150° C. under a sputtering pressure of about 0.4 Pa. Film formation is conducted using silicon as a target with introduction of nitrogen and hydrogen in addition to argon. In the case of silicon oxynitride, a film is formed by introducing argon at a substrate temperature kept at 150° C. under a sputtering pressure of about 0.4 Pa. Film formation is conducted using silicon as a target while introducing nitrogen, nitrogen dioxide and hydrogen in addition to argon. Silicon oxide may be alternatively used as a target.

It is desirable that each of the barrier films 111a and 111c has a thickness in the range of 50 nm to 3 μm. In this embodiment mode, a silicon nitride film is formed to have a thickness of 1 μm.

A method of forming the barrier films is not limited to sputtering; a film formation method can be suitably determined by those who carry out the invention. For example, the barrier films may be formed by an LPCVD method, a plasma CVD method or the like.

It is desirable that the stress relaxing film 111b has a thickness in the range of 200 nm to 2 μm. In this embodiment mode, a polyimide film is formed to have a thickness of 1 μm as the stress relaxing film.

For the barrier films 111a and 111c and the stress relaxing film 111b, it is required to use materials which provide a high selection ratio when the first bonding layer 102 is to be removed in the later step.

Owing to the step shown in FIG. 1A, the OLED can be completely isolated from air. As a result, the degradation of the organic light emitting material due to oxidation can be substantially completely restrained, thereby remarkably improving the reliability of the OLED.

Figure 2A:
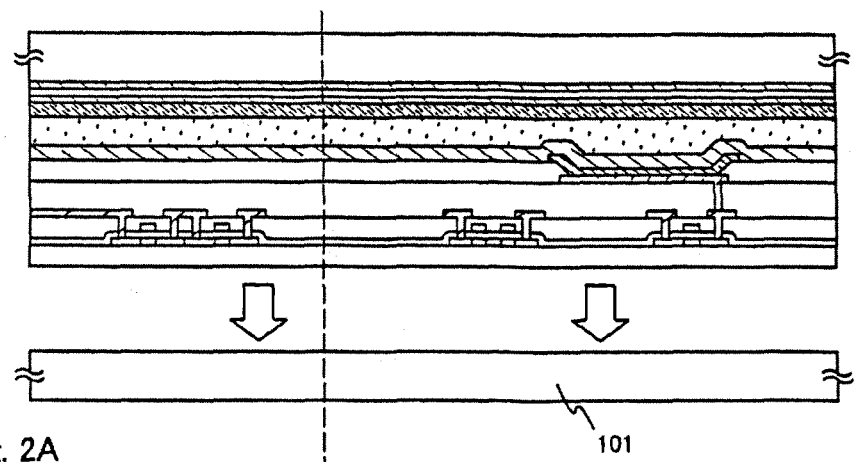
FIGS. 2A and 2B are diagrams showing the manufacturing methods of the light emitting device according to the present invention.

Next, as shown in FIG. 2A, the first substrate 101, the second substrate 110 and all the elements and the entire films formed therebetween are exposed to a gas containing halogen fluoride so as to remove the first bonding layer 102. In this embodiment mode, chlorine trifluoride ($ClF_3$) is used as halogen fluoride, and nitrogen is used as a diluent gas. Alternatively, argon, helium or neon may be used as a diluent gas. A flow rate may be set to 500 sccm ($8.35 \times 10^{-6}$ m$^3$/s) for both gases, and a reaction pressure may be set to 1 to 10 Torr ($1.3 \times 10^2$ to $13 \times 10^3$ Pa). A treatment temperature may be a room temperature (typically, 20 to 27° C.).

In this case, the silicon film is etched whereas the plastic film, the glass substrate, the polyimide film, and the silicon oxide film are not etched. More specifically, through exposure to chlorine trifluoride, the first bonding layer 102 is selectively etched to result in complete removal thereof. Since an active layer of the TFT, which is similarly made of a silicon layer, is not exposed to the outside, the active layer is not exposed to chlorine trifluoride and therefore is not etched.

In this embodiment mode, the first bonding layer 102 is gradually etched from its exposed edge portions. The first substrate 101 and the insulating film 103 are separated from each other when the first bonding layer 102 is completely removed. The TFTs and the OLED, each of which includes a laminate of thin films, remain on the second substrate 110.

A large-sized substrate is not preferred as the first substrate 101 because the etching gradually proceeds from the edges of the first bonding layer 102 and therefore the time required for completely removing the first bonding layer 102 gets long with increase in size. Therefore, it is desirable that this embodiment mode is carried out for the first substrate 101 having a diagonal of 3 inches or less (preferably, 1 inch or less).

Figure 2B:
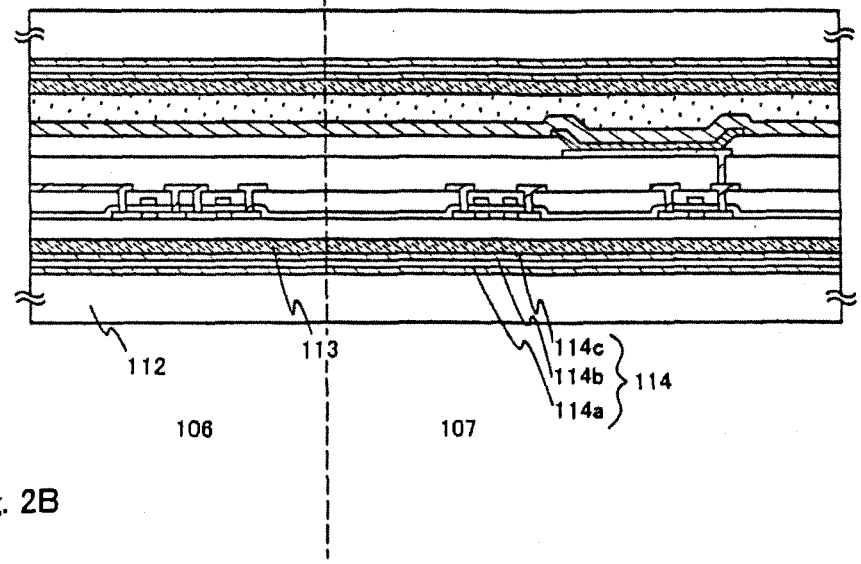

After the peeling of the first substrate 101 in this manner, a third bonding layer 113 is formed as shown in FIG. 2B. Then, a third substrate 112 is bonded to the second substrate 110 through the third bonding layer 113. In this embodiment mode, a plastic substrate is used as the third substrate 112. More specifically, a resin substrate having a thickness of 10 μm or more, for example, a substrate made of PES (polyether sulfone), PC (polycarbonate), PET (polyethylene terephthalate) or PEN (polyethylene naphthalate) can be used as the third substrate 112.

As the third bonding layer 113, an insulating film made of a resin (typically, polyimide, acryl, polyamide or an epoxy resin) can be used. In the case where the third bonding layer 113 is placed on the viewer side (the side of a light emitting device user) when seen from the OLED, a material is required to have light transmittance.

In this embodiment mode, two or more barrier films are formed on the third substrate 112. Then, a stress relaxing film is provided between the two barrier films. As a result, a sealing film having a laminate structure of the barrier films and the stress relaxing film is formed between the second substrate 112 and the third bonding layer 113.

For example, in this embodiment mode, a film made of silicon nitride is formed as a barrier film 114a by sputtering on the third substrate 110; a stress relaxing film 114b containing polyimide is formed on the barrier film 114a; and a film made of silicon nitride is formed as a barrier film 114c by sputtering on the stress relaxing film 114b. A laminate film of the barrier film 114a, the stress relaxing film 114b and the barrier film 114c is collectively referred to as a sealing film 114. Then, the third substrate 112, on which the sealing film 114, is formed is bonded to the element fixed onto the second substrate 110 through the third bonding layer 113.

It is sufficient to provide two or more barrier films. As a material of the barrier films, silicon nitride, silicon oxynitride, aluminum oxide, aluminum nitride, aluminum oxynitride or aluminum silicide oxynitride (AlSiON) can be used.

Since aluminum silicide oxynitride has a relatively high thermal conductivity, its use for the barrier films allows efficient radiation of heat that is generated in the element.

A resin having light transmittance can be used for the stress relaxing film 114b. Typically, polyimide, acryl, polyamide, polyimide amide, benzocyclobutene, an epoxy resin or the like can be used. In this embodiment mode, the stress relaxing film is formed by application of thermally polymerizable polyimide, followed by baking.

A silicon nitride film is formed by introducing argon at a substrate temperature to kept at 150° C. under a sputtering pressure of about 0.4 Pa. Film formation is conducted using silicon as a target with introduction of nitrogen and hydrogen in addition to argon. In the case of silicon oxynitride, a film is formed by introducing argon at a substrate temperature kept at 150° C. under a sputtering pressure of about 0.4 Pa. Film formation is conducted using silicon as a target while introducing nitrogen, nitrogen dioxide and hydrogen in addition to argon. Silicon oxide may be alternatively used as a target.

It is desirable that each of the barrier films 114a and 114c has a thickness in the range of 50 nm to 3 µm. In this embodiment mode, a silicon nitride film is formed to have a thickness of 1 µm.

A method of forming the barrier films is not limited to sputtering; a film formation method can be suitably determined by those who carry out the invention. For example, the barrier films may be formed by an LPCVD method, a plasma CVD method or the like.

It is desirable that the stress relaxing film 114b has a thickness in the range of 200 nm to 2 un. In this embodiment mode, a polyimide film is formed to have a thickness is of 1 µm as the stress relaxing film.

In this manner, a flexible light emitting device interposed between the two flexible substrates 110 and 112 having flexibility can be obtained. With use of the same material for the second substrate 110 and the third substrate 112, the substrates 110 and 112 have the same thermal expansion coefficient. As a result, the substrates 110 and 112 can be hardly affected by a stress strain due to change in temperature.

The light emitting device manufactured according to this embodiment mode allows the manufacture of an element using a semiconductor (for example, a TFT) without being limited by a heat resistance of the plastic substrate. Thus, the light emitting device having extremely high performance can be obtained.

Although the first bonding layer 102 is made of amorphous silicon and is removed with a gas containing halogen fluoride in this embodiment mode, the present invention is not limited to this structure. A material and a removal method of the first bonding layer 102 can be suitably determined by those who carry out the invention. It is important to determine a material and a removal method of the first bonding layer 102 so that the substrates, the elements and the films other than the first bonding layer 102, which are not desired to be removed, ard not removed with removal of the first bonding layer 102 so as not to affect the operation of the light emitting device. It is also important that a material of the first bonding layer 102 does not allow its removal in the process other than in the removal step of the first bonding layer 102.

For example, an organic material, which is entirely or partially vaporized by radiation of a laser beam, can be used as the first bonding layer 102. Additionally, it is desirable that a material having laser beam absorbance, for example, a colored or black material (for example, a resin material containing a black colorant) is used so that a laser beam is efficiently absorbed only by the first bonding layer 102 in the case where a second harmonic wave from a YAG laser is used. A material, which is not vaporized in a heat treatment in the element formation steps, is used for the first bonding layer 102.

Each of the first, second and third bonding layers may be either single-layered or multi-layered. An amorphous silicon film or a DLC film may be provided between the bonding layer and the substrate.

The first bonding layer 102 may be formed of an amorphous silicon film, and the first substrate may be peeled off by radiation of a laser beam onto the first bonding layer 102 in the later step. In this case, in order to facilitate the peeling of the first substrate, it is preferred to use an amorphous silicon film containing a large amount of hydrogen. Hydrogen contained in the amorphous silicon film is vaporized by radiation of a laser beam, so that the first substrate can be easily peeled off.

As a laser beam, a pulse oscillation or a continuous wave excimer laser, a YAG laser or a YVO$_4$ laser can be used. A laser beam is radiated onto the first bonding layer through the first substrate so as to vaporize only the first bonding layer to peel off the first substrate. Therefore, as the first substrate, it is preferred to use a substrate through which at least a radiated laser beam is allowed to pass, typically a substrate having light transmittance, for example, a glass substrate, a quartz substrate or the like, which has a thickness larger than those of the second and third substrates.

In the present invention, in order to allow a laser beam to pass through the first substrate, it is necessary to suitably select the type of a laser beam and the first substrate. For example, when a quartz substrate is used as the first substrate, a YAG laser (fundamental wave (1064 nm), a second harmonic wave (532 nm), a third harmonic wave (355 nm), and a fourth harmonic wave (266 nm)) or an excimer laser (wavelength: 308 nm) is used to form a linear beam which is in turn allowed to pass through the quartz substrate. It is noticed that an excimer laser beam does not pass through a glass substrate. Therefore, when a glass substrate is used as the first substrate, a fundamental wave, a second harmonic wave or a third harmonic wave of the YAG laser, preferably, a second harmonic wave (wavelength: 532 nm), is used to form a linear beam which is in turn allowed to pass through the glass substrate.

Alternatively, for example, a method of separating the first substrate by spraying a fluid (a pressure-applied liquid or gas) on the first bonding layer (typically, a water jet method) may be used.

In the case where the first bonding layer is made of an amorphous silicon film, the first bonding layer may be removed by using hydrazine.

Alternatively, a method of separating the first substrate by etching, described in Japanese Patent Application Laid-open No. Hei 8-288522, may be employed. Specifically, an applied silicon oxide film (SOG) may be used as the first bonding layer which is then removed by hydrogen fluoride. In this case, it is important that the silicon oxide film, which is not desired to be removed, is formed to have a fine structure through a sputtering or a CVD method so that the silicon oxide film provides a high selection ratio when the first bonding layer is to be removed by hydrogen fluoride.

With such a structure, even if substrates having an extremely small thickness, specifically, 50 to 300 μm, preferably 150 to 200 μm, are used as the second and third substrates, a light emitting device with high reliability can be obtained. It was difficult to form an element on such a thin substrate by using a conventionally known manufacture apparatus. However, since the element is formed with being bonded onto the first substrate, a manufacture apparatus using a thin substrate can be used without any alteration of the apparatus.

With the use of the sealing film including the multi-layered insulating film, it is possible to effectively restrain the degradation due to penetration of moisture or oxygen. Moreover, a crack is prevented from occurring upon bend of the substrate. As a result, a light emitting device having enhanced flexibility can be realized.

Embodiment Mode 2

Next, another embodiment mode of the present invention, which differs from the above-described first embodiment mode, will be described.

Figure 3A:
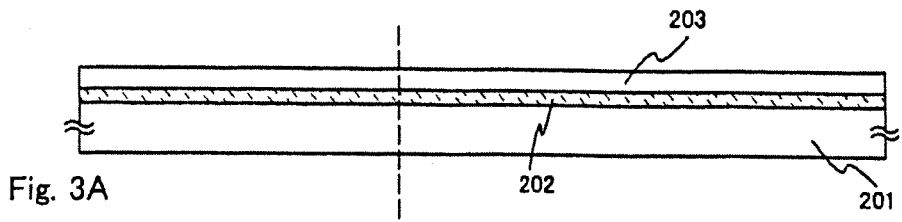
FIGS. 3A to 3D are diagrams showing the manufacturing methods of the light emitting device according to the present invention.

In FIG. 3A, a first bonding layer 202 made of an amorphous silicon film is formed to have a thickness of 100 to 500 nm (300 nm in this embodiment mode) is formed on a first substrate 201. Although a glass substrate is used as the first substrate 201 in this embodiment mode, a quartz substrate, a silicon substrate, a metal substrate or a ceramic substrate may be alternatively used. Any material can be used for the first substrate 201 as long as it is resistant to a treatment temperature in the later manufacture steps.

As a method of forming the first bonding layer 202, a low pressure thermal CVD method, a plasma CVD method, a sputtering method or an evaporation method may be used. On the first bonding layer 202, an insulating film 203 made of a silicon oxide film as is formed to have a thickness of 200 nm. As a method of forming the insulating film 203, a low pressure thermal CVD method, a plasma CVD method, a sputtering method or an evaporation method may be employed. The insulating film 203 serves to protect an element formed on the first substrate 201 when the first bonding layer 202 is removed to peel off the first substrate 201.

Figure 3B:
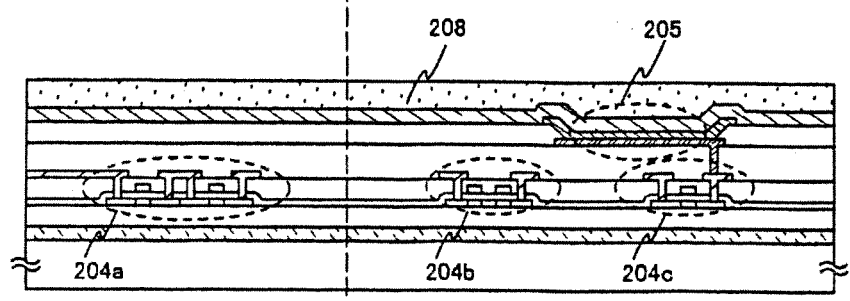

Next, an element is formed on the insulating film 203 (FIG. 3O). The element herein designates a semiconductor element (typically, a TFT) or an MIM element, which is used as a switching element for a pixel, and an OLED and the like in the case of an active matrix light emitting device. In the case of a passive light emitting device, the element designates an OLED. In FIG. 3B, a TFT 204a in a driving circuit 206, TFTs 204b and 204c and an OLED 205 in a pixel portion are shown as representative elements.

Then, an insulating film 208 is formed so as to cover the above-described elements. It is preferred that the insulating film 208 has a flatter surface after its formation. It is not necessarily required to provide the insulating film 208.

Figure 3C:
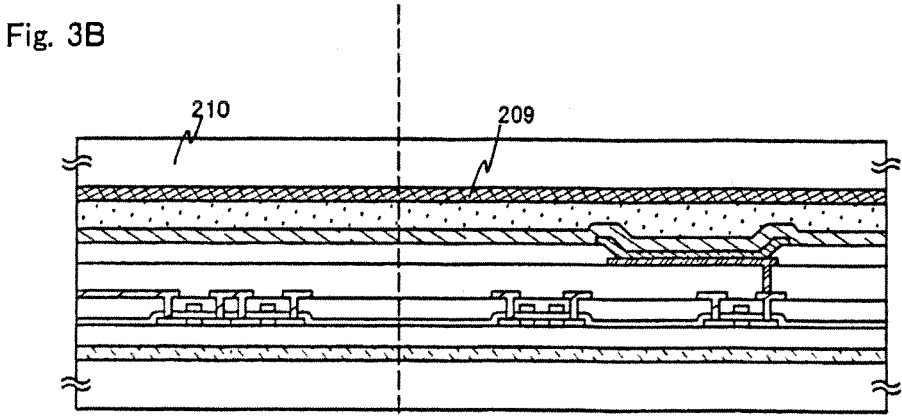

Next, as shown in FIG. 3C, a second substrate 210 is bonded to the first substrate 201 through a second bonding layer 209. Although a glass substrate is used as the second substrate 210 in this embodiment mode, a quartz substrate, a silicon substrate, a metal substrate or a ceramic substrate may also be used. Any material may be used for the second substrate 210 as long as the material is resistant to a treatment temperature in the later manufacture step.

As a material of the second bonding layer 209, it is necessary to use a material which can provide a high selection ratio when the first bonding layer 202 is to be removed in the later step. Furthermore, for the second bonding layer 209, it is required to use such a material that a third bonding layer serving to bond a third substrate is not removed with the removal of the second bonding layer and does not cause the peeling of the third substrate. In this embodiment mode, a polyamic acid solution which is a precursor of a polyimide resin, described in Japanese Patent Application Laid-open No. Hei 5-315630, is used. Specifically, after the second bonding layer 209 is formed to have a thickness of 10 to 15 using a polyamic acid solution, which is an uncured resin, the second substrate 210 and the interlayer insulating film 208 are bonded to each other through thermocompression bonding. Then, heating is conducted so as to temporarily cure the resin.

In this embodiment mode, a material of the second bonding layer 209 is not limited to a polyamic acid solution. Any material may be used as long as it provides a high selection ratio when the first bonding layer 202 is to be removed in the later step and the third bonding layer for bonding the third substrate is not removed with the removal of the second bonding layer 209 and does not cause the peeling of the third substrate. It is important that the second bonding layer 209 is made of such a material that is not removed in the steps other than the step of removing the second bonding layer 209.

Figure 3D:
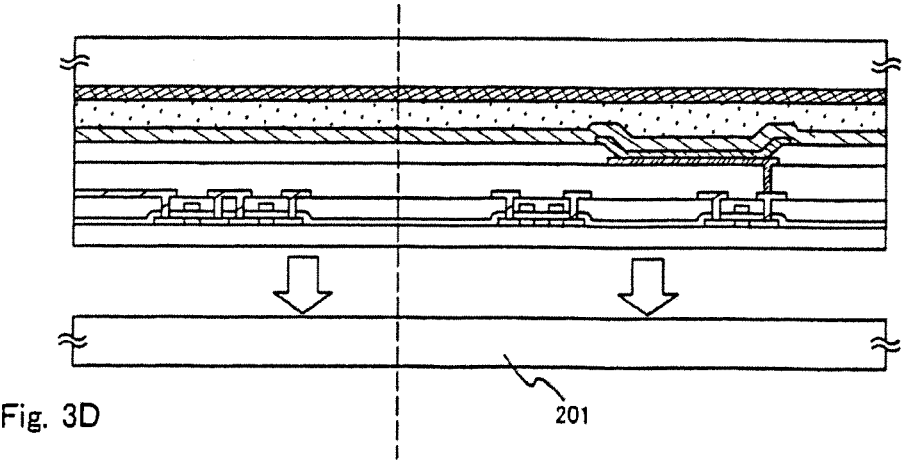

Next, as shown in FIG. 3D, the first substrate 201, the second substrate 210 and all the elements and the entire films formed therebetween are exposed to a gas containing halogen fluoride so as to remove the first bonding layer 202. In this embodiment mode, chlorine trifluoride ($ClF_3$) is used as halogen fluoride, and nitrogen is used as a diluent gas. Alternatively, argon, helium or neon may be used as a diluent gas. A flow rate for both gases may be set to 500 sccm ($8.35 \times 10^{-6}$ $m^3/s$), and a reaction pressure may be set to 1 to 10 Torr ($1.3 \times 10^2$ to $1.3 \times 10^3$ Pa). A treatment temperature may be a room temperature to (typically, 20 to 27° C.).

In this case, the silicon film is etched whereas the plastic film, the glass substrate, the polyimide film, and the silicon oxide film are not etched. More specifically, through exposure to a chlorine trifluoride gas, the first bonding layer 202 is selectively etched to result in complete removal thereof. Since an active layer of the TFT, which is similarly made of a silicon film, is not exposed to the outside, the active layer is not exposed to a chlorine trifluoride gas and therefore is not etched.

In this embodiment mode, the first bonding layer 202 is gradually etched from its exposed edge portions. The first substrate 201 and the insulating film 203 are separated from each other when the first bonding layer 202 is completely removed. After removal of the first bonding layer 202, the TFTs and the OLED, each of which includes a laminate of thin films, remain on the second substrate 210.

A large substrate is not preferred as the first substrate 201 because the first bonding layer 202 is gradually etched from its edges and the time required for completely removing the first bonding layer 202 gets long with increase in size. Therefore, it is as desirable that this embodiment mode is carried out for the first substrate 201 having a diagonal of 3 inches or less (preferably, 1 inch or less).

Figure 4A:
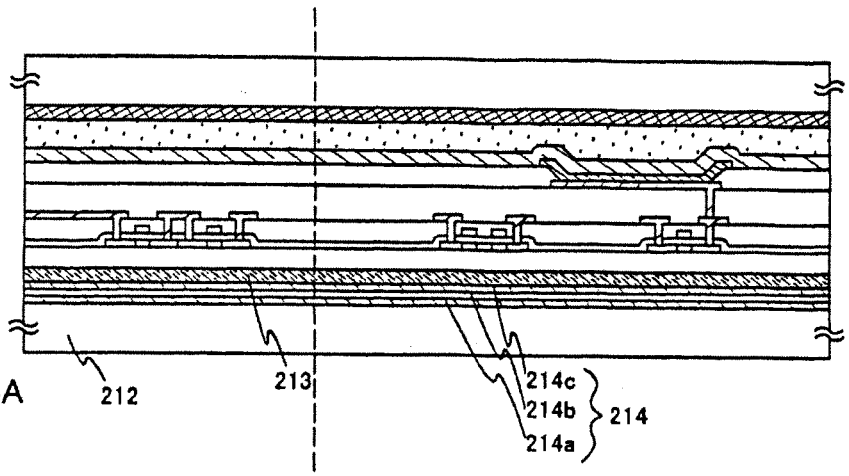
FIGS. 4A to 4C are diagrams showing the manufacturing methods of the light emitting device according to the present invention.

After removal of the first substrate 201 in this manner, a third bonding layer 213 is formed as shown in FIG. 4A. Then, a third substrate 212 is bonded to the second substrate 212 through the third bonding layer 213. In this embodiment mode, a plastic substrate is used as the third substrate 212. More specifically, a resin substrate having a thickness of 10 μm or more, for example, a substrate made of PES (polyether sulfone), PC (polycarbonate), PET (polyethylene terephthalate) or PEN (polyethylene naphthalate) can be used as the third substrate 212.

An insulating film made of a resin (typically, polyimide, acryl, polyamide or an epoxy resin) can be used as the third bonding layer 213. In the case where the third bonding layer 213 is placed on the viewer side (the side of a light emitting device user) when seen from the OLED, a material is required to have light transmittance.

Furthermore, in this embodiment mode, two or more barrier films are formed on the third substrate 212. Then, a stress relaxing film is provided between the two barrier films. As a result, a sealing film having a laminate structure of the barrier films and the stress relaxing film is formed between the third substrate 212 and the third bonding layer 213.

For example, in this embodiment mode, a film made of silicon nitride is formed as a barrier film 214a by sputtering on the third substrate 212; a stress relaxing film 214b containing polyimide is formed on the barrier film 214a; and a film made of silicon nitride is formed as a barrier film 214c by sputtering on the stress relaxing film 214b. A laminate film of the barrier film 214a, the stress relaxing film 214b and the barrier film 214c is collectively referred to as a sealing film 214. Then, the third substrate 212, on which the sealing film 214 is formed, is bonded to the element fixed onto the second substrate 210 through the third bonding layer 213.

It is sufficient to provide two or more bather films. As a material of the barrier films, silicon nitride, silicon oxynitride, aluminum oxide, aluminum nitride, aluminum oxynitride or aluminum silicide oxynitride (AlSiON) can be used.

Since aluminum silicide oxynitride has a relatively high thermal conductivity, its use for the barrier films allows efficient radiation of heat that is generated in the element.

A resin having light transmittance can be used for the stress relaxing film 214b. Typically, polyimide, acryl, polyamide, polyimide amide, benzocyclobutene, an epoxy resin or the like can be used. In this embodiment mode, the stress relaxing film is formed by application of acryl, followed by baking.

A silicon nitride film is formed by introducing argon at a substrate temperature kept at 150° C. under a sputtering pressure of about 0.4 Pa. Film formation is conducted using silicon as a target while introducing nitrogen and hydrogen in addition to argon. In the case of silicon oxynitride, a film is formed by introducing argon at a substrate temperature kept at 15° C. under a sputtering pressure of about 0.4 Pa. Film formation is conducted using silicon as a target while introducing nitrogen, nitrogen dioxide and hydrogen in addition to argon. Silicon oxide may be alternatively used as a target.

It is desirable that each of the barrier films 214a and 214c has a thickness in the range of 50 nm to 3 μm. In this embodiment mode, a silicon nitride film is formed to have a thickness of 1 μm.

A method of forming the barrier films is not limited to sputtering; a film formation method can be suitably determined by those who carry out the invention. For example, the barrier films may be formed by an LPCVD method, a plasma CVD method or the like.

It is desirable that the stress relaxing film 214b has a thickness in the range of 200 nm to 2 μm. In this embodiment mode, an acryl film is formed to have a thickness of 1 μm.

Figure 4B:
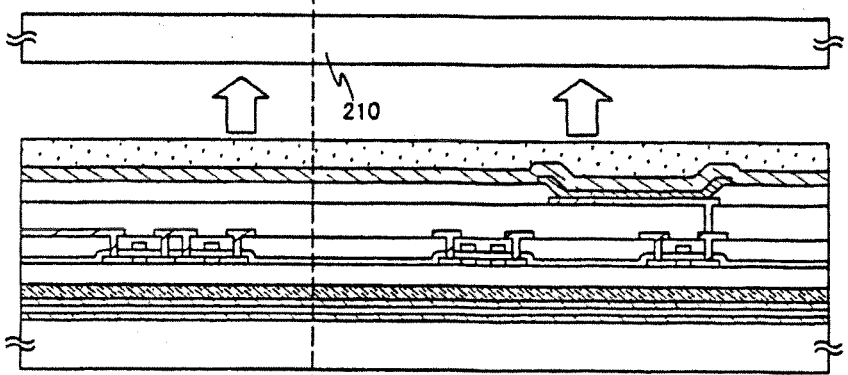

Next, as shown in FIG. 4B, the second bonding layer 209 is removed to peel off the second substrate 210. More specifically, the second bonding layer 209 is removed by being dipped into water for about an hour, thereby allowing the second substrate 210 to be peeled off.

It is important to select a method of peeling off the second bonding layer 209 according to a material of the second bonding layer 209, a material of the element or the films, a material of the substrate, and the like.

Figure 4C:
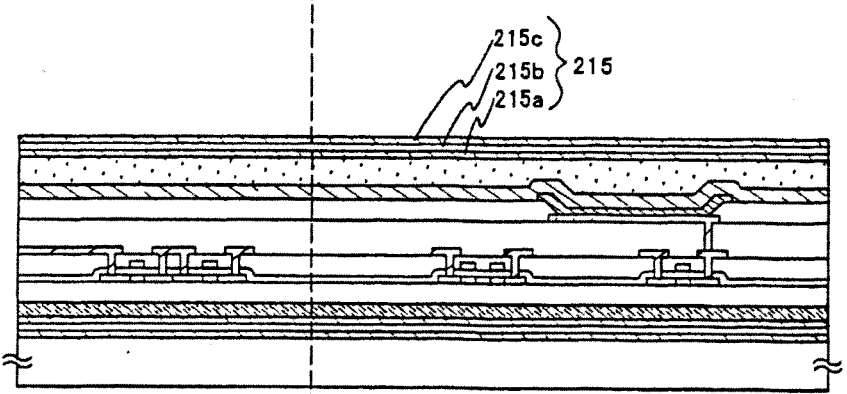

Next, as shown in FIG. 4C, barrier films in two or more layers are provided on a the side where the second substrate 210 is peeled off, that is, on the side opposite to the third substrate through the OLED. Then, a stress relaxing film is provided between the two barrier films.

In this embodiment mode, for example, on the side of the insulating film 208 opposite to the side being in contact with the second substrate 210, a film made of silicon nitride is formed as a barrier film 215a by sputtering; a stress relaxing film 215b containing polyimide is formed on the barrier film 215a; and a film made of silicon nitride is formed as a barrier film 215c by sputtering on the stress relaxing film 215b. A laminate film of the barrier film 215a, the stress relaxing film 215b and the barrier film 215c is collectively referred to as a sealing film 215.

It is sufficient to provide two or more barrier films. As a material of the barrier films, silicon nitride, silicon oxynitride, aluminum oxide, aluminum nitride, aluminum oxynitride or aluminum silicide oxynitride (AlSiON) can be used.

Since aluminum silicide oxynitride has a relatively high thermal conductivity, its use for the barrier films allows efficient radiation of heat that is generated in the element.

A resin having light transmittance can be used for the stress relaxing film 215b. Typically, polyimide, acryl, polyimide, polyimide amide, benzocyclobutene, an epoxy resin or the like can be used. In this embodiment mode, the stress relaxing film is formed by application of acryl, followed by baking.

A silicon nitride film is formed by introducing argon at a substrate temperature kept at 150° C. under a sputtering pressure of about 0.4 Pa. Film formation is conducted using silicon as a target while introducing nitrogen and hydrogen in addition to argon. In the case of silicon oxynitride, a film is formed by introducing argon at a substrate temperature kept at 150° C. under a sputtering pressure of about 0.4 Pa. Film formation is conducted using silicon as a target while introducing nitrogen, nitrogen dioxide and hydrogen in addition to argon. Silicon oxide may be alternatively used as a target.

It is desirable that each of the barrier films 215a and 215c has a thickness in the range of 50 nm to 3 μm. In this embodiment mode, a silicon nitride film is formed to have a thickness of 1 μm.

A method of forming the barrier films is not limited to sputtering; a film formation method can be suitably determined by those who carry out the invention. For example, a film may be formed by an LPCVD method, a plasma CVD method or the like.

It is desirable that the stress relaxing film 215b has a thickness in the range of 200 nm to 2 μm. In this embodiment mode, an acryl film is formed to have a thickness of 1 μm.

In this manner, a flexible light emitting device using a single plastic substrate 212 can be obtained.

Since an element using a semiconductor (for example, a TFT) can be formed without being limited by a heat resistance of the plastic substrate, the light emitting device having extremely high performance can be manufactured according to this embodiment mode.

Although the first bonding layer 202 is made of amorphous silicon, and is removed with a gas containing halogen fluoride in this embodiment mode, the present invention is not limited to this structure. A material and a removal method of the first bonding layer 202 can be suitably determined by those who carry out the invention. It is to important to determine a material and a removal method of the first bonding layer 202 so that the substrates, the other bonding layers, the elements and the films other than the first bonding layer 202, which are not desired to be removed, are not removed with removal of the first bonding layer 202 so as not to affect the operation of the light emitting device. It is also important that a material of the first bonding layer 202 does not allow its removal in the process other than the removal step of the first bonding layer 202.

Although a polyamic acid solution, which is a precursor of a polyimide resin, is used for the second bonding layer 209 which is then removed with water, the structure of the present invention is not limited thereto. A material and a removal method of the second bonding layer 209 can be suitably determined by those who carry out the invention. It is important to determine a material and a removal method of the second bonding layer 209 so that the substrates, the other bonding layers, the elements and the films other than the second bonding layer 209, which are not desired to be removed, are not removed with removal of the second bonding layer 209 so as not to affect the operation of the light emitting device. It is also important that a material of the second bonding layer 209 does not allow its removal in the process other than the removal step of the second bonding layer 209.

For example, an organic material, which is entirely or partially vaporized by radiation of a laser beam, can be used for the first and second bonding layers 202 and 209. Additionally, it is desirable that a material having laser beam absorbance, for example, a colored or black material (for example, a resin material containing a black colorant) is used so that a laser beam is efficiently absorbed only by the first and second bonding layers 202 and 209 in the case where a second harmonic wave from a YAG laser is used. The first and second bonding layers 202 and 209, which are not vaporized in a heat treatment in the element formation steps, are employed.

Each of the first, second and third bonding layers may be either single-layered or multi-layered. An amorphous silicon film or a DLC film may be provided between the bonding layer and the substrate.

The first bonding layer 202 or the second bonding layer 209 may be formed of an amorphous silicon film, and the substrate may be peeled off by radiation of a laser beam onto the first bonding layer 202 or the second bonding layer 209 in the later step. In this case, in order to facilitate the peeling of the first substrate, it is preferred to use an amorphous silicon film containing a large amount of hydrogen. Hydrogen contained in the amorphous silicon film is vaporized by radiation of a laser beam, so that the substrate can be easily peeled off.

As a laser beam, a pulse oscillation or a continuous wave excimer laser, a YAG laser or a YVO$_4$ laser can be used. In the case where the first substrate is to be peeled off, a laser beam is radiated onto the first bonding layer through the first substrate so as to vaporize only the first bonding layer to peel off the first substrate. In the case where the second substrate is to be peeled off, a laser beam is radiated onto the second bonding layer through the second substrate so as to vaporize only the second bonding layer to peel off the second substrate. Therefore, as the first or second substrate, it is preferred to use a substrate having a thickness larger than that of the third substrates, which allows at least a radiated laser beam to pass through, typically a substrate having light transmittance, for example, a glass substrate, a quartz substrate or the like.

In the present invention, in order to allow a laser beam to pass through the first or second substrate, it is necessary to suitably select the type of a laser beam and the type of the first substrate. For example, when a quartz substrate is used as the first substrate, a YAG laser (fundamental wave (1064 nm), a second harmonic wave (532 nm), a third harmonic wave (355 nm), and a fourth harmonic wave (266 nm)) or an excimer laser (wavelength: 308 nm) is used to form a linear beam which is in turn allowed to pass through the quartz substrate. It is noticed that an excimer laser beam does not passes through a glass substrate. Therefore, when a glass substrate is used, a fundamental wave, a second harmonic wave or a third harmonic wave of the YAG laser, preferably, a second harmonic wave (wavelength: 532 nm), is used to form a linear beam which is in turn allowed to pass through the glass substrate.

Alternatively, for example, a method of separating the first substrate by spraying a fluid (a pressure-applied liquid or gas) on the first bonding layer (typically, a water jet method) may be used.

In the case where the first bonding layer is made of an amorphous silicon film, the first bonding layer may be removed by using hydrazine.

Alternatively, a method of separating the first substrate by etching, described in Japanese Patent Application Laid-open No. Hei 8-288522, may be used. Specifically, an applied silicon oxide film (SOG) may be used as the first or second bonding layer which is then removed by hydrogen fluoride. In this case, it is important that the silicon oxide film, which is not desired to be removed, is formed to have a fine structure through a sputtering or a CVD method so that the silicon oxide film provides a high selection ratio when the first or second bonding layer is to be removed by hydrogen fluoride.

With such a structure, even if a substrate having an extremely small thickness, specifically, 50 to 300 μm, preferably 150 to 200 μm is used as the third substrate, a light emitting device with high reliability can be obtained. It is difficult to form an element on such a thin substrate by using a conventionally known manufacture apparatus. However, since the element is formed with being bonded onto the first and second substrates, a manufacturing apparatus using a thin substrate can be used without any alteration of the apparatus.

With the use of the sealing film including the multi-layered insulating film, it is possible to effectively restrain the degradation due to penetration of moisture or oxygen. Moreover, a crack is prevented from occurring upon bend of the substrate. As a result, a light emitting device having enhanced flexibility can be realized.

In the first and second embodiment modes, either an anode or a cathode of the OLED may be used as a pixel electrode.

Embodiments

Hereinafter, embodiments of the present invention will be described.

Embodiment 1

In Embodiment 1, the outward appearance of a light emitting device according to the present invention and its connection to an FPC will be described.

Figure 5A:
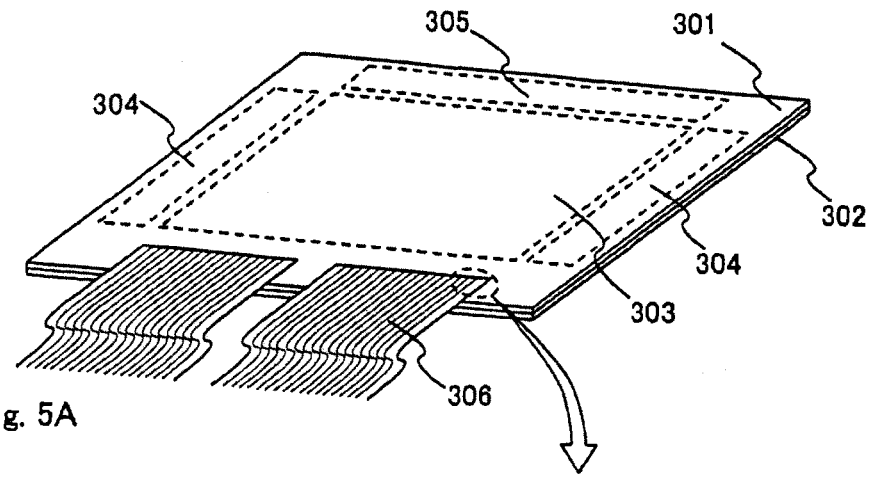
FIG. 5A is a diagram showing the appearance of a light emitting device according to the present invention.

FIG. 5A shows an example of a top view of a light emitting device according to the present invention, described in Embodiment mode 1. A second substrate 301 and a to third substrate 302 are both plastic substrates having flexibility. A pixel portion 303 and driving circuits (a source-side driving circuit 304 and a gate-side driving circuit 305) are provided between the second substrate 301 and the third substrate 302.

In FIG. 5A, there is shown an example where the source-side driving circuit 304 and the gate side-driving circuit 305 are formed on the substrate on which the pixel portion 303 is also formed. However, the driving circuits represented by the source-side driving circuit 304 and the gate side-driving circuit 305 may be formed on a different substrate from the substrate on which the pixel portion 303 is formed. In this case, the driving circuits may be connected to the pixel portion 303 via an FPC or the like.

The number and the arrangement of the source-side driving circuit 304 and the gate-side driving circuit 305 are not limited to the structure shown in FIG. 5A.

The reference symbol 306 designates an FPC, via which a signal from an IC including a controller or a source voltage are supplied to the pixel portion 303, the source-side driving circuit 304 and the gate-side driving circuit 305.

Figure 5B:
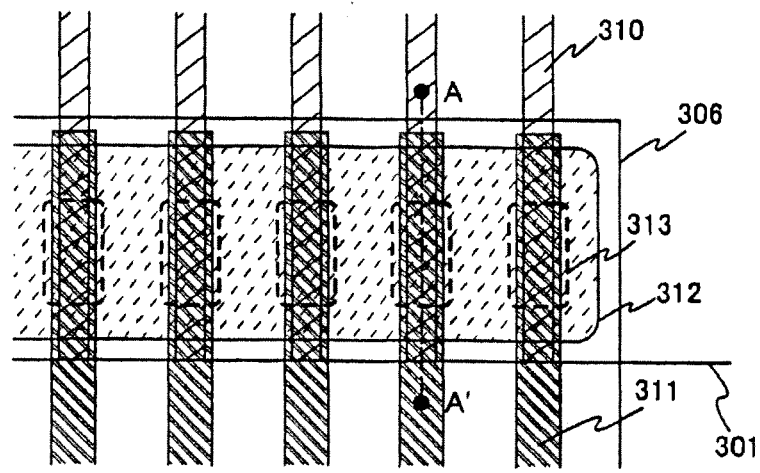
FIG. 5B is an enlarged view showing a connecting portion with an FPC.
Figure 5C:
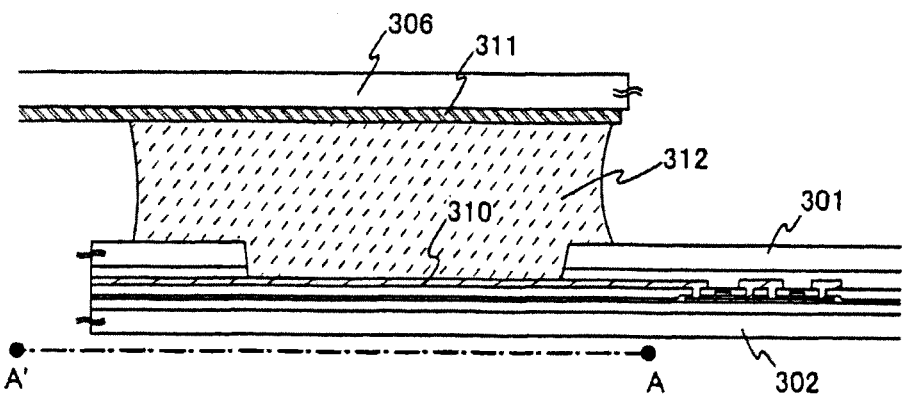
FIG. 5C is a cross-sectional view showing the connecting portion.

FIG. 5B is an enlarged view of a portion surrounded by a dot line in FIG. 5A where the FPC 306 and the second substrate 301 are connected to each other. FIG. 5C is a cross-sectional view taken along a line A-A' in FIG. 5B.

Wirings 310, which are extended so as to supply a signal or a source voltage to the pixel portion 303, the source-side driving circuit 304 and the gate-side driving circuit 305, are provided between the second substrate 301 and the third substrate 302. Terminals 311 are provided for the FPC 306.

The second substrate 301 and various films such as a sealing film and an insulating film provided between the second substrate 301 and the extended wirings 310 are partially removed by a laser beam or the like to provide contact holes 313. Therefore, a plurality of the extended wirings 310 are exposed through the contact holes 313, and are respectively connected to the terminals 311 through a conductive resin 312 having anisotropy.

Although there is shown the example where the extended wirings 310 are partially exposed from the side of the second substrate 301 in FIGS. 5A to 5C, the present invention is not limited thereto. Alternatively, the extended wirings may be partially to exposed from the side of the third substrate 302.

Figure 6A:
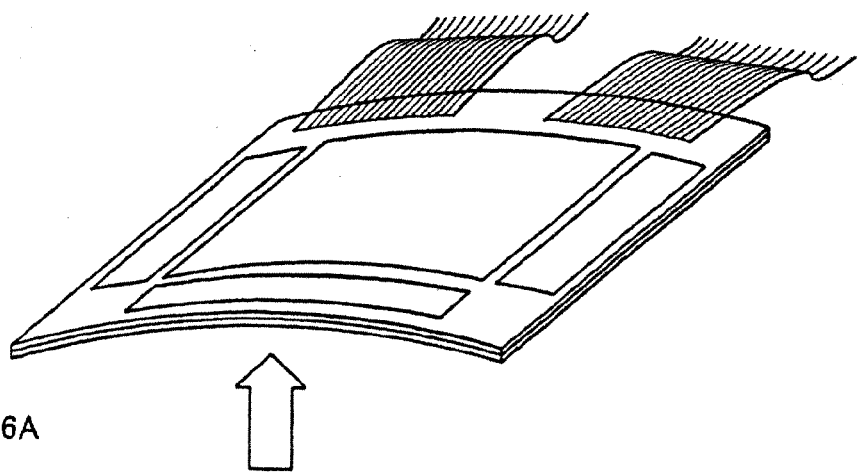
FIG. 6A is a diagram showing a light emitting device according to the present invention in a bent state.

FIG. 6A shows the light emitting device shown in FIG. 5A in a bent state. Since the second substrate and the third substrate of the light emitting device described in Embodiment mode 1 both have flexibility, the light emitting device can be bent to a certain degree as shown in FIG. 6A. Thus, such a light emitting device has a wide range of applications because it can be used for a display having a curved surface, a show window and the like. Moreover, not only the light emitting device described in Embodiment mode 1 but also the light emitting device described in Embodiment mode 2 can be similarly bent.

Figure 6B:
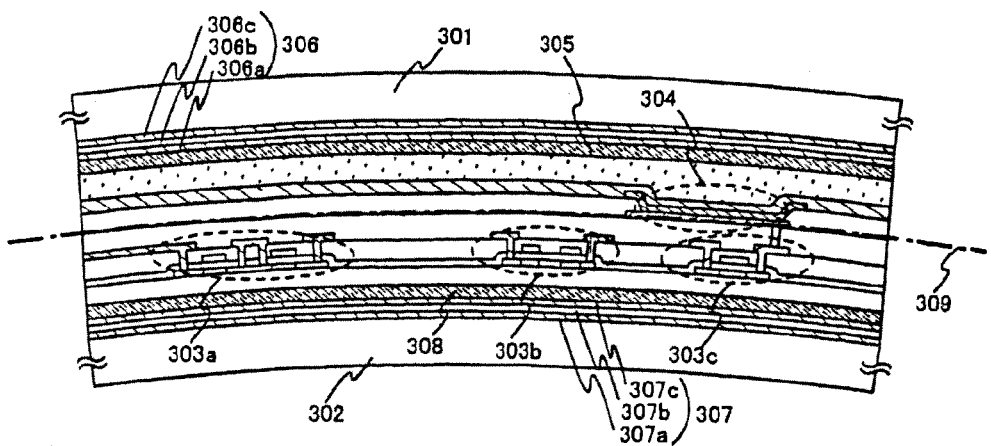
FIG. 6B is a cross-sectional view thereof.

FIG. 6B is a cross-sectional view of the light emitting device shown in FIG. 6A. A plurality of elements are formed between the second substrate 301 and the third substrate 302. Herein, TFTs 303a, 303b and 303c and an OLED 304 are representatively shown. A broken line 309 represents a center line between the second substrate 301 and the third substrate 302.

A barrier film 306a, a stress relaxing film 306b and a barrier film 306c (collectively referred to as a sealing film 306) are provided between the second substrate 301 and a plurality of the elements. A barrier film 307a, a stressi relaxing film 307b and a barrier film 307c (collectively referred to as a sealing film 307) are provided between the third substrate 302 and a plurality of the elements.

Furthermore, a second bonding layer 305 is provided between the sealing film 306 and a plurality of the elements, whereas a third bonding layer 308 is provided between the sealing film 307 and a plurality of the elements.

Figure 7:
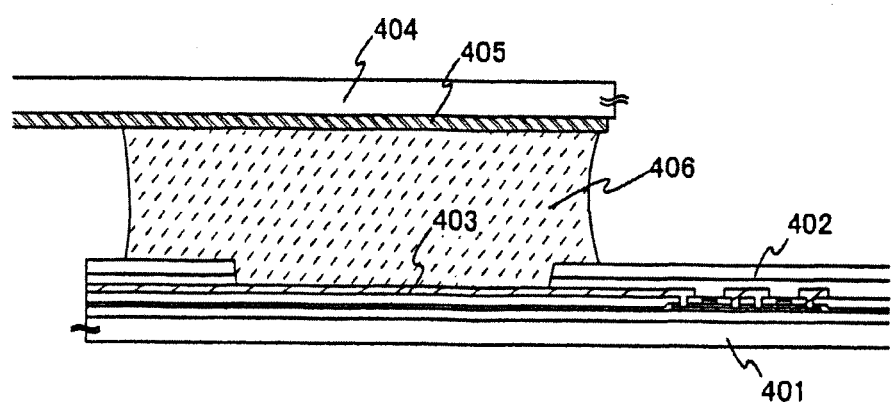
FIG. 7 is a cross-sectional view showing a portion where a light emitting device according to the present invention is connected with an FPC.

Next, the connection of the light emitting device described in Embodiment mode 2 to the FPC will be described. FIG. 7 is a cross-sectional view showing a portion where the light emitting device described in Embodiment mode 2 and the FPC are connected to each other.

A wiring 403 for extension is provided on a third substrate 401. A scaling film 402 is formed so as to cover the wiring 403 for extension and a plurality of elements provided on the third substrate 401. Although the sealing film 402 is shown as a single-layered film in FIG. 7, the sealing film practically includes a plurality of barrier films and a stress relaxing film interposed therebetween.

Various films such as the sealing film 402 and an insulating film provided between the third substrate 401 and the extended wring 403 are partially removed by a laser beam or the like to provide a contact hole. Therefore, the extended wiring 403 is exposed through the contact hole, and is electrically connected to a terminal 405 included in an FPC 404 through a conductive resin 406 having anisotropy.

Although there is shown the example where the extended wiring is partially exposed from the side of the sealing film 402 in FIG. 7, the present invention is not limited thereto. Alternatively, the extended wiring may be partially exposed from the side of the third substrate.

Embodiment 2

In Embodiment 2, an example of Embodiment mode 1 according to the present invention will be described.

Figure 8A:
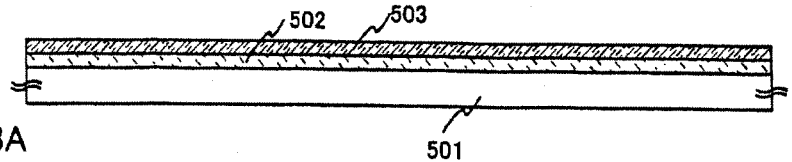

In FIG. 8A, a first bonding layer 502 made of an applied silicon oxide film (SOG) is formed to have a thickness of 100 to 500 nm (300 nm in this embodiment) is formed on a first substrate 501. Although a glass substrate is used as the first substrate 501 in this embodiment, a quartz substrate, a silicon substrate, a metal substrate or a ceramic substrate may be alternatively used. Any material can be used for the first substrate 501 as long as it is resistant to a treatment temperature in the later manufacturing steps.

As a method of forming the SOG film, an iodine solution is added to an SOG solution by spin coating, which is then dried to desorb iodine therefrom. Then, a thermal treatment at about 400° C. is conducted to form the SOG film. In this embodiment, the SOG film having a thickness of 100 nm is formed. A method of forming the SOG film as the first bonding layer 502 is not limited to the above method. Both an organic SOG and an inorganic SOG may be used as the SOG; any SOG can be used as long as it can be removed with hydrogen fluoride in the later step. It is important that the silicon oxide film, which is not desired to be removed, is formed to have a fine structure by sputtering or a CVD method so as to provide a high selection ratio when the first bonding layer is to be removed with hydrogen fluoride.

Next, a protection film made of Al is formed on the first bonding layer 502 by a low pressure thermal CVD method, a plasma CVD method, a sputtering method or an evaporation method. In this embodiment, a protection film 503 made of Al is formed to have a thickness of 200 nm on the first bonding layer 502 by sputtering.

Although Al is used as a material of the protection film 503 in this embodiment, the present invention is not limited thereto. It is important to select such a material that is not removed with removal of the first bonding layer 502 and that is not removed in the process other than in the step of removing the protection film 503. Furthermore, it is important that such a material does not allow removal of the other films and the substrates in the step of removing the protection film 503. The protection film 503 serves to protect an element formed on the first substrate 501 when the first bonding layer 502 is removed to peel off the first substrate 501.

Figure 8B:
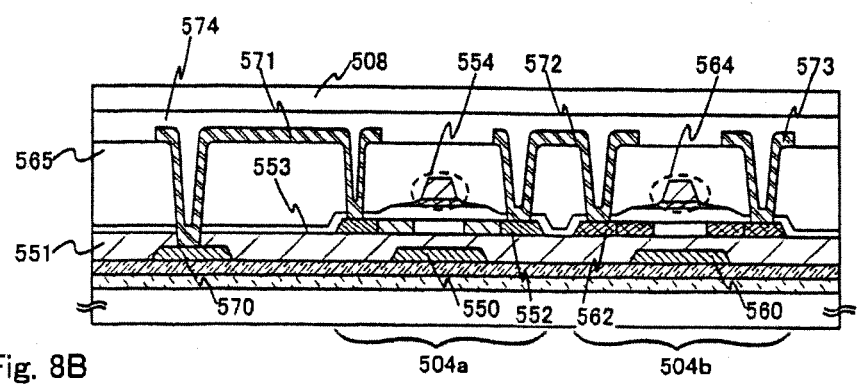

Next, an element is formed on the protection film 503 (FIG. 8B). In FIG. 8B, TFTs 504a and 504b in a driving circuit are shown as representative elements.

In this embodiment, the TFT 504a is an n-channel TFT whereas the TFT 504b is a p-channel TFT. The TFTs 504a and 504b form a CMOS.

The TFT 504a includes a first electrode 550 formed on the protection film 503, an insulating film 551 formed so as to cover the first electrode 550, a semiconductor film 552 formed so as to be in contact with the insulating film 551, an insulating film 553 formed so as to be in contact with the semiconductor film 552, and a second electrode 554 in contact with the insulating film 553.

The TFT 504b includes a first electrode 560, the insulating film 551 formed so as to cover the first electrode 560, a semiconductor film 562 formed so as to be in contact with the insulating film 551, the insulating film 553 formed so as to be in contact with the semiconductor film 562, and a second electrode 564 in contact with the insulating film 553.

A terminal 570, which is formed simultaneously with the first electrodes 550 and 560, is provided on the protection film 503.

Then, an insulating film 565 is formed so as to cover the TFTs 504a and 504b. A wiring 571 being in contact with the semiconductor film 552 and the terminal 570, a wiring 572 being in contact with the semiconductor films 552 and 562, and a wiring 573 being in contact with the semiconductor film 562 are formed via contact holes formed to through the insulating films 565, 551 and 553.

An insulating film 574 is formed so as to cover the wirings 571, 572 and 573 and the insulating film 565. Although not shown, an OLED is formed on the insulating film 574.

Then, an insulating film 508 is formed so as to cover these elements. It is preferred that the insulating film 508 has a flatter surface after its formation. The insulating film 508 is not necessarily formed.

Figure 8C:
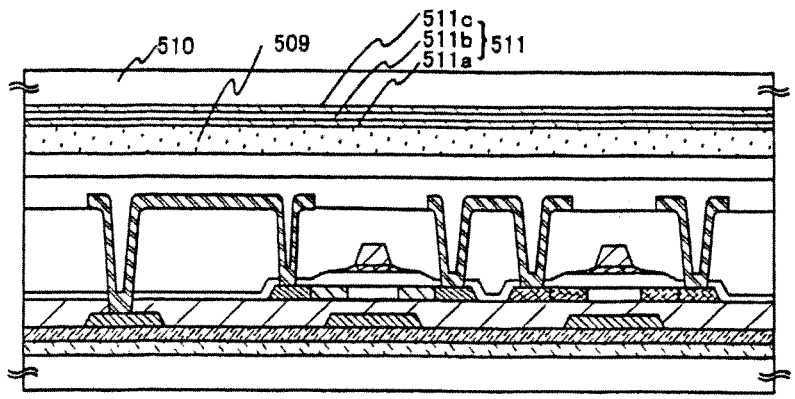

Next, as shown in FIG. 8C, a second substrate 510 is bonded to the first substrate through a second bonding layer 509. A plastic substrate is used as the second substrate 510 in this embodiment. More specifically, a resin substrate having a thickness of 10 i m or more, for example, a substrate made of PES (polyether sulfone), PC (polycarbonate), PET (polyethylene terephthalate) or PEN (polyethylene naphthalate) can be used as the second substrate 510.

As a material of the second bonding layer 509, it is necessary to use a material which can provide a high selection ratio when the first bonding layer 502 is to be removed in the later step. Typically, an insulating film made of a resin can be used. Although polyimide is used in this embodiment, acryl, polyamide or an epoxy resin can also be used. In the case where the second bonding layer 509 is placed on the viewer side (the side of a light emitting device user) when seen from the OLED, a material is required to have light transmittance.

Furthermore, in this embodiment, two or more barrier films are formed on the second substrate 510. Then, a stress relaxing film is provided between the two barrier films. As a result, a sealing film having a laminate structure of the barrier films and the stress relaxing film is formed between the second substrate 510 and the second bonding layer 509.

For example, in this embodiment, a film made of silicon nitride is formed as a barrier film 511a by sputtering on the second substrate 510; a stress relaxing film 511b containing polyimide is formed on the barrier film 511a; and a film made of silicon nitride is formed as a barrier film 511c by sputtering on the stress relaxing film 511b. A laminate film of the barrier film 511a, the stress relaxing film 511b and the barrier film 511c is collectively referred to as a sealing film 511. Then, the second substrate 510, on which the sealing film 511 is formed, is bonded to the element formed on the first substrate through the second bonding layer 509.

It is sufficient to provide two or more barrier films. As a material of the barrier films, silicon nitride, silicon oxynitride, aluminum oxide, aluminum nitride, aluminum oxynitride or aluminum silicide oxynitride (AlSiON) can be used.

A resin having light transmittance can be used for the stress relaxing film 511b. Typically, polyimide, acryl, polyamide, polyimide amide, benzocyclobutene, an epoxy resin or the like can be used. In this embodiment, the stress relaxing film is formed by application of thermally polymerizable polyimide, followed by baking.

A silicon nitride film is formed while introducing argon at a substrate temperature kept at 150° C. under a sputtering pressure of about 0.4 Pa. Film formation is conducted using silicon as a target while introducing nitrogen and hydrogen in addition to argon. In the case of silicon oxynitride, a film is formed by introducing argon at a substrate temperature kept at 150° C. under a sputtering pressure of about 0.4 Pa. Film formation is conducted using silicon as a target while introducing nitrogen, nitrogen dioxide and hydrogen in addition to argon. Silicon oxide may be alternatively used as a target.

It is desirable that each of the barrier films 511a and 511c has a thickness in the range of 50 nm to 3 μm. In this embodiment, a silicon nitride film is formed to have a thickness of 1 μm.

A method of forming the barrier films is not limited to sputtering; a film formation method can be suitably determined by those who carry out the invention. For example, a film may be formed by an LPCVD method, a plasma CVD method or the like.

It is desirable that the stress relaxing film 511b has a thickness in the range of 200 nm to 2 μm. In this embodiment, a polyimide film is formed to have a thickness of 1 μm.

For the first and second barrier layers 511a and 511c and the stress relaxing layer 511b, it is necessary to use materials which provide a high selection ratio when the first bonding layer 502 is to be removed in the later step.

Owing to the process shown in FIG. 8C, the OLED can be completely isolated from air. As a result, the degradation of the organic light emitting material due to oxidation can be substantially completely restrained, thereby remarkably improving the reliability of the OLED.

Figure 8D:
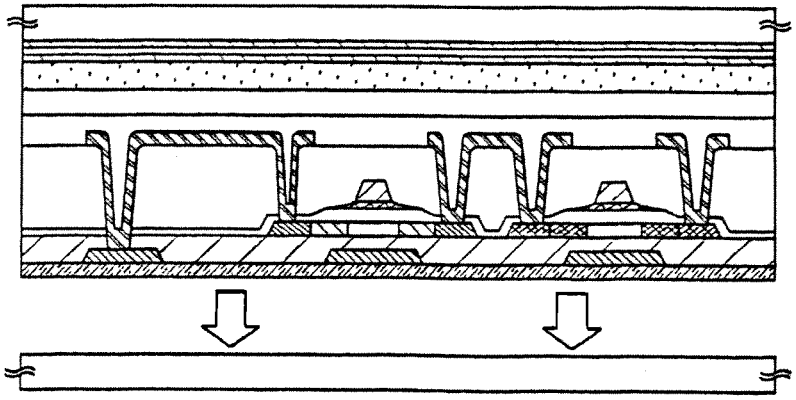

Next, as shown in FIG. 8D, the first bonding layer 502 is removed with hydrogen is fluoride. In this embodiment, the first and second substrates 501 and 510, and all the elements and the entire films formed therebetween are dipped into buffered hydrofluoric acid (HF/NH$_4$F=0.01 to 0.2, for example, 0.1) so as to remove the first bonding layer 502.

Since the silicon oxide film, which is not desired to be removed, is made of a fine film formed by sputtering or a CVD method, only the first bonding layer is removed with hydrogen fluoride.

In the case of this embodiment, the first bonding layer 502 is gradually etched from its exposed edge portions. The first substrate 501 and the protection film 503 are separated from each other when the first bonding layer 502 is completely removed. After removal of the first bonding layer 502, the TFTs and the OLED, each of which includes a laminate of thin films, remain on the second substrate 510.

A large substrate is not preferred as the first substrate 501 because the time required for completely removing the first bonding layer 502 from its edges gets long with increase in size of the first substrate. Therefore, it is desirable that this embodiment is carried out for the first substrate 501 having a diagonal of 3 inches or less (preferably, 1 inch or less).

Figure 9A:
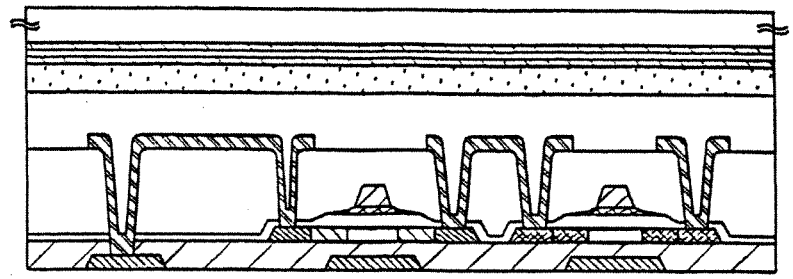
FIGS. 9A to 9C are diagrams showing the manufacturing methods of the light emitting device according to the present invention.

Next, as shown in FIG. 9A, the protection film 503 is removed. In this embodiment, the protection film 503 made of Al is removed by wet etching with a phosphoric acid type etchant so as to expose the terminal 570 and the first electrodes 550 and 560.

Figure 9B:
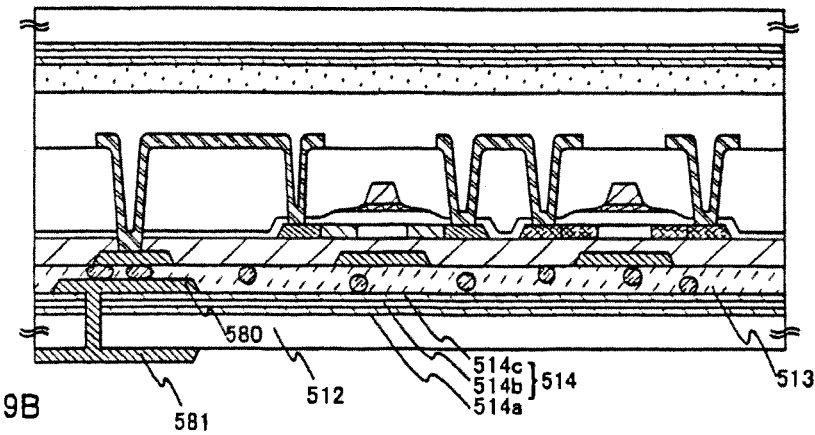

Then, as shown in FIG. 9B, a third bonding layer 513 made of a conductive resin having anisotropy is formed. Through the third bonding layer 513, the third substrate 512 is attached to the side where the terminal 570 and the first electrodes 550 and 560 are exposed.

In this embodiment, a plastic substrate is used as the third substrate 512. More specifically, a resin substrate having a thickness of 10 μm or more, for example, a substrate made of PES (polyether sulfone), PC (polycarbonate), PET (polyethylene terephthalate) or PEN (polyethylene naphthalate) can be used as the third substrate 512.

As the third bonding layer 513, an insulating film made of a resin (typically, polyimide, acryl, polyamide or an epoxy resin) can be used. In the case where the third bonding layer 513 is placed on the viewer side when seen from the OLED, a material is required to have light transmittance.

In this embodiment, two or more barrier films are formed on the third substrate 512. Then, a stress relaxing film is provided between the two barrier films. As a result, a sealing film having a laminate structure of the barrier films and the stress relaxing film is formed between the third substrate 512 and the third bonding layer 513.

For example, in this embodiment, a film made of silicon nitride is formed as a barrier film 514a by sputtering on the third substrate 512; a stress relaxing film 514b containing polyimide is formed on the barrier film 514a; and a film made of silicon nitride is formed as a barrier film 514c by sputtering on the stress relaxing film 514b. A laminate film of the barrier film 514a, the stress relaxing film 514b and the barrier film 514c is collectively referred to as a sealing film 514. Then, the third substrate 512, on which the sealing film 514 is formed, is bonded to the element fixed onto the second substrate 510 through the third bonding layer 513.

It is sufficient to provide two or more barrier films. As a material of the barrier so films, silicon nitride, silicon oxynitride, aluminum oxide, aluminum nitride, aluminum oxynitride or aluminum silicide oxynitride (AlSiON) can be used.

A resin having light transmittance can be used for the stress relaxing film 514b. Typically, polyimide, acryl, polyamide, polyimide amide, benzocyclobutene, an epoxy resin or the like can be used. In this embodiment, the stress relaxing film is formed by application of thermally polymerizable polyimide, followed by baking.

A silicon nitride film is formed by introducing argon at a substrate temperature kept at 150° C. under a sputtering pressure of about 0.4 Pa. Film formation is conducted using silicon as a target while introducing nitrogen and hydrogen in addition to argon. In the case of silicon oxynitride, a film is formed by introducing argon at a substrate to temperature kept at 150° C. under a sputtering pressure of about 0.4 Pa. Film formation is conducted using silicon as a target while introducing nitrogen, nitrogen dioxide and hydrogen in addition to argon. Silicon oxide may be alternatively used as a target:

It is desirable that each of the barrier films 514a and 514c has a thickness in the range of 50 nm to 3 μm. In this embodiment, a silicon nitride film is formed to have a thickness of 1 μm.

A method of forming the barrier films is not limited to sputtering; a film formation method can be suitably determined by those who carry out the invention. For example, a film may be formed by an LPCVD method, a plasma CVD method or the like.

It is desirable that the stress relaxing film 514b has a thickness in the range of 200 nm to 2 μm. In this embodiment, a polyimide film is formed to have a thickness of 1 μm.

Then, a contact hole is formed through the third substrate 512 and the sealing film 514 by radiation of a laser beam or the like. Al is evaporated on a portion of the third substrate 512 where the contact hole is formed and the periphery thereof, thereby forming terminals 580 and 581 on the respective surfaces of the third substrate 512, which are electrically connected to each other. A method of forming the terminals 580 and 581 is not limited to the above-mentioned structure.

The terminal 580 formed on the third substrate 512 is electrically connected through the third bonding layer 513 to the terminal 570 that is formed simultaneously with the first electrodes 550 and 560.

In this manner, a flexible light emitting device interposed between the plastic substrates 510 and 512 can be obtained. With the use of the same material for the second substrate 510 and the third substrate 512, the substrates 510 and 512 have the same thermal expansion coefficient. As a result, the substrates 510 and 512 can be hardly affected by a stress strain due to change in temperature.

Figure 9C:
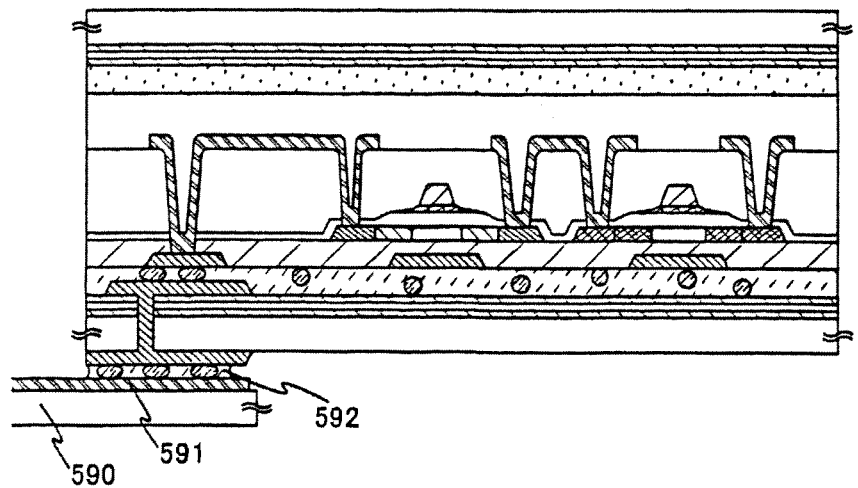

As shown in FIG. 9C, the terminal 581 formed so as not to be in contact with the third bonding layer 513 but to be in contact with the third substrate 512 and the terminal 591 included in an FPC 590 are connected to each other through a fourth bonding layer 592 made of an electrically conductive resin having anisotropy.

The light emitting device manufactured according to this embodiment allows the manufacture of an element employing a semiconductor (for example, a TFT) without being limited by a heat resistance of the plastic substrate. Thus, the light emitting device having extremely high performance can be obtained.

Although the first bonding layer 502 is made of SOG and is removed with hydrogen fluoride in this embodiment, the present invention is not limited to this structure. A material and a removal method of the first bonding layer 502 can be suitably determined by those who carry out the invention. It is important to determine a material and a removal method of the first bonding layer 502 so that the substrates, the element and the films other than the first bonding layer 502, which are not desired to be removed, are not removed with removal of the first bonding layer 502 and does not affect the operation of the light emitting device. Moreover, it is also important that a material of the first bonding layer 502 does not allow its removal in the process other than the removal step of the first bonding layer 502.

For example, an organic material, which is entirely or partially vaporized by radiation of a laser beam, can be used as the first bonding layer 502. Additionally, it is desirable that a material having laser beam absorbance, for example, a colored or black material (for example, a resin material containing a black colorant) is used so that a laser beam is efficiently absorbed only by the first bonding layer 502 in the case where a second harmonic wave from a YAG laser is used. The first bonding layer 502, which is not vaporized in a heat treatment in the element formation steps, is used.

Each of the first, second and third bonding layers may be either single-layered or multi-layered. An amorphous silicon film or a DLC film may be provided between the bonding layer and the substrate.

The first bonding layer 502 may be formed of an amorphous silicon film, and in the later step, the first substrate may be peeled off by radiation of a laser beam onto the first bonding layer 502. In this case, in order to facilitate the peeling of the first substrate, it is preferred to use an amorphous silicon film containing a large amount of hydrogen. Hydrogen contained in the amorphous silicon film is vaporized by radiation of a laser beam, so that the first substrate can be easily peeled off.

As a laser beam, a pulse or a continuous wave excimer laser, a YAG laser or a $YVO_4$ laser can be used. A laser beam is radiated onto the first bonding layer through the first substrate so as to vaporize only the first bonding layer to peel off the first substrate. Therefore, as the first substrate, it is preferred to use a substrate having a thickness larger than that of the second and third substrates, which allows at least a radiated laser beam to pass through, typically, a substrate having light transmittance, for example, a glass substrate, a quartz substrate or the like.

In the present invention, in order to allow a laser beam to pass through the first substrate, it is necessary to suitably select the type of a laser beam and the first substrate. For example, when a quartz substrate is used as the first substrate, a YAG laser (fundamental wave (1064 nm), a second harmonic wave (532 nm), a third harmonic wave (355 nm), and a fourth harmonic wave (266 nm)) or an excimer laser (wavelength: 308 nm) is used to form a linear beam which is in turn allowed to pass through the quartz substrate. It is noticed that an excimer laser beam does not pass through a glass substrate. Therefore, when a glass substrate is used as the first substrate, a fundamental wave, a second harmonic wave or a third harmonic wave of the YAG laser, preferably, a second harmonic wave (wavelength: 532 nm), is used to form a linear beam which is in turn allowed to pass through the glass substrate.

Alternatively, a method of separating the first substrate by spraying a fluid (a pressure-applied liquid or gas) on the first bonding layer (typically, a water jet method) or a combination with this method can be used.

In the case where the first bonding layer is made of an amorphous silicon film, the first bonding layer may be removed by using hydrazine.

Alternatively, a method of separating the first substrate by etching, described in JP 8-288522 A, may be used. Specifically, an applied silicon oxide film (SOG) may be used as the first bonding layer which is removed by hydrogen fluoride. In this case, it is important that the silicon oxide film, which is not desired to be removed, is formed to have a fine structure through a sputtering or a CVD method so that the silicon oxide film provides a high selection ratio when the first bonding layer is to be removed with hydrogen fluoride.

With such a structure, even if substrates having an extremely small thickness, specifically, 50 to 300 μm, preferably 150 to 200 μm are used as the second and third substrates, a light emitting device with high reliability can be obtained. It was difficult to form an element on such a thin substrate by using a conventionally known manufacturing apparatus. However, since the element is formed with being bonded onto the first substrate, a manufacturing apparatus can be used with the use of a thick substrate without any alteration of the apparatus.

With the use of the scaling film including the multi-layered insulating film, it is possible to effectively restrain the degradation due to penetration of moisture or oxygen. Moreover, a crack is prevented from occurring upon bend of the substrate. As a result, a light emitting device having enhanced flexibility can be realized.

Embodiment 3

In this embodiment, a method of forming TFT of a driving circuit (a source signal line driver circuit and a gate signal line driver circuit) arranged in the periphery of the pixel portion and a pixel portion will be explained in detail. In this embodiment, in relation to the driver circuit, CMOS circuit is only shown as a basic unit for brief description.

First, as shown in FIG. 10A, a first bonding film 5001 formed of amorphous silicon film is formed and having a thickness of from 100 to 500 nm (preferably 300 nm) on a first substrate 5000 formed of glass such as barium borosilicate glass or alumino borosilicate glass represented by #7059 glass and #1737 glass of CORNING Corporation, etc. The first bonding film 5001 is formed by using a low pressure CVD method, plasma CVD method, sputtering method or evaporation method can be used. The first bonding film 5001 is formed by using sputtering method in this embodiment.

Next, a base film 5002 formed of an insulating film such as a silicon oxide film, a silicon oxynitride film or a silicon nitride oxide film is formed on the first bonding film 5001. The base film 5002 has an effect of protecting an element formed on a substrate 5000 when the first bonding layer 5001 is removed to peel off the substrate 5000. For example, a silicon nitride oxide film formed from $SiH_4$, $NH_3$ and $N_2O$ by the plasma CVD method and having a thickness of from 10 to 200 nm (preferably 50 to 100 nm) is formed. Similarly, a hydrogenerated silicon nitride oxide film formed from $SiH_4$ and $N_2O$ and having a thickness of from 50 to 200 nm (preferably 100 to 150 nm) is layered thereon. In this embodiment, the base film 5002 has a two-layer structure, but may also be formed as a single layer film of one of the above insulating films, or a laminate film having more than two layers of the above insulating films.

Island-like semiconductor layers 5003 to 5006 are formed from a crystalline semiconductor film obtained by conducting laser crystallization or a known thermal crystallization on a semiconductor film having an amorphous structure. These island-like semiconductor layers 5003 to 5006 each have a thickness of from 25 to 80 nm (preferably 30 to 60 nm). No limitation is put on the material of the crystalline semiconductor film, but the crystalline semiconductor film is preferably formed from silicon, a silicon germanium (SiGe) alloy, etc.

When the crystalline semiconductor film is to be manufactured by the laser crystallization method, an excimer laser, a YAG laser and an $YVO_4$ laser of a pulse oscillation type or continuous light emitting type are used. When these lasers are used, it is preferable to use a method in which a laser beam radiated from a laser emitting device is converged into a linear shape by an optical system and then is irradiated to the semiconductor film. A crystallization condition is suitably selected by an operator. When the excimer laser is used, pulse oscillation frequency is set to 300 Hz, and laser energy density is set to from 100 to 400 ml/cm$^2$ (typically 200 to 300 mJ/cm$^2$. When the YAG laser is used, pulse oscillation frequency is preferably set to from 30 to 300 kHz by using its second harmonic, and laser energy density is preferably set to from 300 to 600 mJ/cm$^2$ (typically 350 to 500 mJ/cm$^2$). The laser beam converged into a linear shape and having a width of from 100 to 1000 μm, e.g. 400 μm is, is irradiated to the entire substrate face. At this time, overlapping ratio of the linear laser beam is set to from 50 to 90%.

Next, a gate insulating film 5007 covering the island-like semiconductor layers 5003 to 5006 is formed. The gate insulating film 5007 is formed from an insulating film containing silicon and having a thickness of from 40 to 150 nm by using the plasma CVD method or a sputtering method. In this embodiment, the gate insulating film 5007 is formed from a silicon nitride oxide film of 120 nm in thickness. However, the gate insulating film is not limited to such a silicon nitride oxide film, but it may be an insulating film containing other and having a single layer or a laminated layer structure. For example, when a silicon oxide film is used, TEOS (Tetraethyl Orthosilicate) and $O_2$ are mixed by the plasma CVD method, the reaction pressure is set to 40 Pa, the substrate temperature is set to from 300 to 400° C., and the high frequency (1356 MHZ) power density is set to from 0.5 to 0.8 W/cm$^2$ for electric discharge. Thus, the silicon oxide film can be formed by discharge. The silicon oxide film manufactured in this way can then obtain preferable characteristics as the gate insulating film by thermal annealing at from 400 to 500° C.

A first conductive film 5008 and a second conductive film 5009 for forming a gate electrode are formed on the gate insulating film 5007. In this embodiment, the first conductive film 5008 having a thickness of from 50 to 100 nm is formed from Ta, and the second conductive film 5009 having a thickness of from 100 to 300 nm is formed from W.

The Ta film is formed by a sputtering method, and the target of Ta is sputtered by Ar. In this case, when suitable amounts of Xe and Kr are added to Ar, internal stress of the Ta film is released, and pealing off this film can be prevented. Resistivity of the Ta film of α phase is about 20 μΩcm, and this Ta film can be used for the gate electrode. However, resistivity of the Ta film of β phase is about 180 μΩcm, and is not suitable for the gate electrode. When tantalum nitride having a crystal structure close to that of the α phase of Ta and having a thickness of about 10 to 50 nm is formed in advance as the base for the Ta film to form the Ta film of the α phase, the Ta film of α phase can be easily obtained.

The W film is formed by the sputtering method with W as a target. Further, the W film can be also formed by a thermal CVD method using tungsten hexafluoride (WF$_6$). In any case, it is necessary to reduce resistance to use this film as the gate electrode. It is desirable to set resistivity of the W film to be equal to or smaller than 20 μΩcm. When crystal grains of the W film are increased in size, resistivity of the W film can be reduced. However, when there are many impurity elements such as oxygen, etc. within the W film, crystallization is prevented and resistivity is increased. Accordingly, in the case of the sputtering method, a W-target of 99.9999% or 99.99% in purity is used, and the W film is formed by taking a sufficient care of not mixing impurities from a gaseous phase into the W film when the film is to be formed. Thus, a resistivity of from 9 to 20 μΩcm can be realized.

In this embodiment, the first conductive film 5008 is formed from Ta, and the second conductive film 5009 is formed from W. However, the present invention is not limited to this case. Each of these conductive films may also be formed from an element selected from Ta, W, Ti, Mo, Al and Cu, or an alloy material or a compound material having these elements as principal components. Further, a semiconductor film represented by a poly crystal silicon film doped with an impurity element such as phosphorus may also be used. Examples of combinations other than those shown in this embodiment include: a combination in which the first conductive film 5008 is formed from tantalum nitride (TaN), and the second conductive film 5009 is formed from W; a combination in which the first conductive film 5008 is formed from tantalum nitride (TaN), and the second conductive film 5009 is formed from Al; and a combination in which the first conductive film 5008 is formed from tantalum nitride (TaN), and the second conductive film 5009 is formed from Cu.

Next, a mask 5010 is formed from a resist, and first etching processing for forming an electrode and wiring is performed. In this embodiment, an ICP (Inductively Coupled Plasma) etching method is used, and $CF_4$ and $Cl_2$ are mixed with a gas for etching. RF (13.56 MHZ) power of 500 W is applied to the electrode of coil type at a pressure of 1 Pa so that plasma is generated. RF (13.56 MHZ) of 100 W power is also applied to a substrate side (sample stage), and a substantially negative self bias voltage is applied. When $CF_4$ and $Cl_2$ are mixed, the W film and the Ta film are etched to the same extent.

Under the above etching condition, end portions of a first conductive layer and a second conductive layer are formed into a tapered shape by effects of the bias voltage applied to the substrate side by making the shape of the mask formed from the resist into an appropriate shape. The angle of a taper portion is set to from 15° to 45°. It is preferable to increase an etching time by a ratio of about 10 to 20% so as to perform the etching without leaving the residue on the gate insulating film. Since a selection ratio of a silicon nitride oxide film to the W film ranges from 2 to 4 (typically 3), an exposed face of the silicon nitride oxide film is etched by about 20 to 50 nm by over-etching processing. Thus, conductive layers 5011 to 5016 of a first shape (first conductive layers 5011a to 5016a and second conductive layers 5011b to 5016b) formed of the first and second conductive layers are formed by the first etching processing. A region that is not covered with the conductive layers 5011 to 5016 of the first shape is etched by about 20 to 50 nm in the gate insulating film 5007, so that a thinned region is formed. (See FIG. 10A).

Then, an impurity element for giving an n-type conductivity is added by performing first doping processing. A doping method may be either an ion doping method or an ion implantation method. The ion doping method is carried out under the condition that a dose is set to from $1\times10^{13}$ to $5\times10^{14}$ atoms/cm$^2$, and an acceleration voltage is set to from 60 to 100 keV. An element belonging to group 15, typically, phosphorus (P) or arsenic (As) is used as the impurity element for giving the n-type conductivity. However, phosphorus (P) is used here. In this case, the conductive layers 5011 to 5015 serve as masks with respect to the impurity element for giving the n-type conductivity, and first impurity regions 5017 to 5025 are formed in a self-aligning manner. The impurity element for giving the n-type conductivity is added to the first impurity regions 5017 to 5025 in a concentration range from $1\times10^{20}$ to $1\times10^{21}$ atoms/cm$^3$. (See FIG. 10B).

Second etching processing is next performed without removing the resist mask as shown in FIG. 10C. A W film is etched selectively by using $CF_4$, $Cl_2$ and $O_2$. The conductive layers 5026 to 5031 of a second shape (first conductive layers 5026a to 5031a and second conductive layers 5026b to 5031b) are formed by the second etching processing. A region of the gate insulating film 5007, which is not covered with the conductive layers 5026 to 5031 of the second shape, is further etched by about 20 to 50 nm so that a thinned region is formed.

An etching reaction in the etching of the W film using the mixed gas of $CF_4$ and $Cl_2$ and the Ta film can be assumed from the vapor pressure of a radical or ion species generated and a reaction product. When the vapor pressures of a fluoride and a chloride of W and Ta are compared, the vapor pressure of $WF_6$ as a fluoride of W is extremely high, and vapor pressures of other $WCl_5$, $TaF_5$ and $TaCl_5$ are approximately equal to each other. Accordingly, both the W film and the Ta film are etched using the mixed gas of $CF_4$ and $Cl_2$. However, when a suitable amount of $O_2$ is added to this mixed gas, $CF_4$ and $O_2$ react and become CO and F so that a large amount of F-radicals or F-ions is generated. As a is result, the etching speed of the W film whose fluoride has a high vapor pressure is increased. In contrast to this, the increase in etching speed is relatively small for the Ta film when F is increased. Since Ta is easily oxidized in comparison with W, the surface of the Ta film is oxidized by adding $O_2$. Since no oxide of Ta reacts with fluorine or chloride, the etching speed of the Ta film is further reduced. Accordingly, it is possible to make a difference in etching speed between the W film and the Ta film so that the etching speed of the W film can be set to be higher than that of the Ta film.

As shown in FIG. 11A, second doping processing is then performed. In this case, an impurity element for giving the n-type conductivity is doped in a smaller dose than in the first doping processing and at a high acceleration voltage by reducing a dose lower than that in the first doping processing. For example, the acceleration voltage is set to from 70 to 120 keV, and the dose is set to $1\times10^{13}$ atoms/cm². Thus, a new impurity region is formed inside the first impurity region formed in the island-like semiconductor layer in FIG. 10B. In the doping, the conductive layers 5026 to 5030 of the second shape are used as masks with respect to the impurity element, and the doping is performed such that the impurity element is also added to regions underside the first conductive layers 5026a to 5030a. Thus, third impurity regions 5032 to 5041 are formed. The third impurity regions 5032 to 5036 contain phosphorus (P) with a gentle concentration gradient that conforms with the thickness gradient in the tapered portions of the first conductive layers 5026a to 5030a. In the semiconductor layers that overlap the tapered portions of the first conductive layers 5026a to 5030a, the impurity concentration is slightly lower around the center than at the edges of the tapered portions of the first conductive layers 5026a to 5030a. However, the difference is very slight and almost the same impurity concentration is kept throughout the semiconductor layers.

Third etching treatment is then carried out as shown in FIG. 11B. $CHF_4$ is used as etching gas, and reactive ion etching (RIE) is employed. Through the third etching treatment, the tapered portions of the first conductive layers 5026a to 5031a are partially etched to reduce the regions where the first conductive layers overlap the semiconductor layers. Thus formed are third shape conductive layers 5037 to 5042 (first conductive layers 5037a to 5042a and second conductive layers 5037b to 5042b). At this point, regions of the gate insulating film 5007 that are not covered with the third shape conductive layers 5037 to 5042 are further etched and thinned by about 20 to 50 nm.

Third impurity regions 5032 to 5036 are formed through the third aching treatment. The third impurity regions 5032a to 5036a that overlap the first conductive layers 5037a to 5041a, respectively, and second impurity regions 5032b to 5036b each formed between a first impurity region and a third impurity region.

As shown in FIG. 11C, fourth impurity regions 5043 to 5054 having the opposite conductivity type to the first conductivity type are formed in the island-like semiconductor layers 5004 and 5006 for forming p-channel TFTs. The third shape conductive layers 5038b and 5041b are used as masks against the impurity element and impurity regions are formed in a self-aligning manner. At this point, the island-like semiconductor layers 5003 and 5005 for forming n-channel TFTs and the wiring portion 5042 are entirely covered with a resist mask 5200. The impurity regions 5043 to 5054 have already been doped with phosphorus in different concentrations. The impurity regions 5043 to 5054 are doped with diborane ($B_2H_6$) through ion doping such that diborane dominates phosphorus in each region and each region contain the impurity element in a concentration of $2\times10^{20}$ to $2\times10^{21}$ atoms/cm³.

Through the steps above, the impurity regions are formed in the respective island-like semiconductor layers. The third shape conductive layers 5037 to 5041 overlapping the island-like semiconductor layers function as gate electrodes. Reference numeral 5042 function as island-like source signal line.

After resist mask 5200 is removed, a step of activating the impurity elements added to the island-like semiconductor layers is performed to control the conductivity type. This process is performed by a thermal annealing method using a furnace for furnace annealing. Further, a laser annealing method or a rapid thermal annealing method (RTA method) can be applied. In the thermal annealing method, this process is performed at a temperature of from 400 to 700° C., typically from 500 to 600° C. within a nitrogen atmosphere in which oxygen concentration is equal to or smaller than 1 ppm and is preferably equal to or smaller than 0.1 ppm. In this embodiment, heat treatment is performed for four hours at a temperature of 500° C. When a wiring material used in the third shape conductive layers 5037 to 5042 is weak against heat, it is preferable to perform activation after an interlayer insulating film (having silicon as a principal component) is formed in order to protect wiring, etc.

Further, the heat treatment is performed for 1 to 12 hours at a temperature of from 300 to 450° C. within an atmosphere including 3 to 100% of hydrogen so that the island-like semiconductor layer is hydrogenerated. This step is to terminate a dangling bond of the semiconductor layer by hydrogen thermally excited. Plasma hydrogenation (using hydrogen excited by plasma) may also be performed as another measure for hydrogenation.

Next, as shown in FIG. 12A, a first interlayer insulating film 5055 is formed from a nitride oxide silicon film to 100 to 200 nm thick. The second interlayer insulating film 5056 from an organic insulating material is formed on the first interlayer insulating film. Thereafter, contact holes are formed through the first interlayer insulating film 5055, the second interlayer insulating film 5056 and the gate insulating film 5007. Each wiring (including a connecting wiring and a signal line) 5057 to 5062, and 5064 are patterned and formed. Thereafter, a pixel electrode 5063 coming in contact with the connecting wiring 5062 is patterned and formed.

A film having an organic resin as a material is used as the second interlayer insulating film 5056. Polyimide, polyamide, acrylic, BCB (benzocyclobutene), etc. can be used as this organic resin. In particular, since the second interlayer insulating film 5056 is provided mainly for planarization, acrylic excellent in leveling the film is preferable. In this embodiment, an acrylic film having a thickness that can sufficiently level a level difference caused by the TFT is formed. The film thickness thereof is preferably set to to from 1 to 5 μm (is further preferably set to from 2 to 4 μm).

In the formation of the contact holes, contact holes reaching n-type impurity regions 5017, 5018, 5021 and 5023 or p-type impurity regions 5043 to 5054, a contact hole reaching wiring 5042, an contact hole reaching an electric current supply line (not illustrated), and contact holes reaching gate electrodes (not illustrated) are formed.

Further, a laminate film of a three-layer structure is patterned in a desired shape and is used as wiring (including a connecting wiring and signal line) 5057 to 5062, 5064. In this three-layer structure, a Ti film of 100 [nm] in thickness, a Ti-containing aluminum film of 300 [nm] in thickness, and a Ti film of 150 [nm] in thickness are continuously formed by the sputtering method. However, another conductive film may also be used.

In this embodiment, an ITO film of 110 nm in thickness is formed as a pixel electrode 5063, and is patterned. Contact is made by arranging the pixel electrode 5063 such that this pixel electrode 5063 comes in contact with the connecting electrode 5062 and is overlapped with this connecting wiring 5062. Further, a transparent conductive film provided by mixing 2 to 20% of zinc oxide (ZnO) with indium oxide may also be used. This pixel electrode 5063 becomes an anode of the OLED. (See FIG. 12A)

As shown in FIG. 12B, an insulating film (a silicon oxide film in this embodiment) containing silicon and having a thickness of 500 nm is next formed. A third interlayer insulating film 5065 is formed in which an opening is formed in a position corresponding to the pixel electrode 5063. When the opening is formed, a side wall of the opening can easily be tapered by using the wet etching method. When the side wall of the opening is not gentle enough, deterioration of an organic light emitting layer caused by a level difference becomes a notable problem.

Next, an organic light emitting layer 5066 and a cathode (MgAg electrode) 5067 are continuously formed by using the vacuum evaporation method without exposing to, the atmosphere. The organic light emitting layer 5066 has a thickness of from 80 to 200 nm (typically from 100 to 120 nm), and the cathode 5067 has a thickness of from 180 to 300 nm (typically from 200 to 250 nm).

In this process, the organic light emitting layer is sequentially formed with respect to a pixel corresponding to red, a pixel corresponding to green and a pixel corresponding to blue. In this case, since the organic light emitting layer has an insufficient resistance against a solution, the organic light emitting layer must be formed separately for each color instead of using a photolithography technique. Therefore, it is preferable to cover a portion is except for desired pixels using a metal mask so that the organic light emitting layer is formed selectively only in a required portion.

Namely, a mask for covering all portions except for the pixel corresponding to red is first set, and the organic light emitting layer for emitting red light are selectively formed by using this mask. Next, a mask for covering all portions except for the pixel corresponding to green is set, and the organic light emitting layer for emitting green light are selectively formed by using this mask. Next, a mask for covering all portions except for the pixel corresponding to blue is similarly set, and the organic light emitting layer for emitting blue light are selectively formed by using this mask. Here, different masks are used, but instead the same single mask may be used repeatedly.

Here, a system for forming three kinds of OLED corresponding to RGB is used. However, a system in which an OLED for emitting white light and a color filter are combined, a system in which the OLED for emitting blue or blue green light is combined with a fluorescent substance (a fluorescent color converting layer: CCM), a system for overlapping the OLED respectively corresponding to R, G, and B with the cathodes (opposite electrodes) by utilizing a transparent electrode, etc. may be used.

A known material can be used as the organic light emitting layer 5066. An organic material is preferably used as the known material in consideration of a driving voltage. For example, a four-layer structure consisting of a hole injection layer, a hole transportation layer, a light emitting layer and an electron injection layer is preferably used for the organic light emitting layer.

The cathode 5067 is formed next on the pixel (pixel on the same line) included the switching TFT in which the gate electrode is connected to the same gate signal line by using a metal mask. This embodiment uses MgAg for the cathode 5067 but it is not limited thereto. Other known materials may be used for the cathode 5067.

Finally, a planarization film 5068 formed of a silicon nitride film and having a thickness of 300 nm is formed. In reality, the planarization film 5068 plays a role of protecting the organic light emitting layer 5066 from moisture, etc. However, reliability of OLED can be further improved by forming the planarization film 5068.

Thus, the state as shown in FIG. 12B is completed. Though not shown in figures, according to manufacturing method in Embodiment Mode 1, the second substrate providing sealing film is bonded to the planarization film 5068 by using a second bonding layer. In addition, following steps can be executed in according to methods shown in Embodiment Mode 1. In accordance of manufacturing method in Embodiment Mode 2, the second substrate providing sealing film is bonded to the planarization film 5068 by using a second bonding layer. In addition, following steps can be executed in according to methods shown in Embodiment Mode 2.

In the process of forming the light emitting device in this embodiment, the source signal line is formed from Ta and W that, are materials of the gate electrodes, and the gate signal line is formed from Al that is a wiring material of the source and drain electrodes for conveniences of the circuit construction and procedures in the process. However, different materials may also be used.

The light emitting device in this embodiment has very high reliability and improved operating characteristics by arranging the TFTs of the optimal structures in a driving circuit portion in addition to the pixel portion. Further, in a crystallization process, crystallinity can be also improved by adding a metal catalyst such as Ni. Thus, a driving frequency of the source signal line driving circuit can be set to 10 MHz or more.

First, the TFT having a structure for reducing hot carrier injection so as not to reduce an operating speed as much as possible is used as an n-channel type TFT of a CMOS circuit forming the driving circuit portion. Here, the driving circuit includes a shift register, a buffer, a level shifter, a latch in line sequential driving, a transmission gate in dot sequential driving, etc.

In the case of this embodiment, an active layer of the n-channel type TFT includes a source region, a drain region, an overlap LDD region (Lov region) that is overlapped with the gate electrode through the gate insulating film, an offset LDD region (Loff region) that is not overlapped with the gate electrode through the gate insulating film, and channel formation region.

Deterioration by the hot carrier injection in the p-channel type TFT of the CMOS circuit is almost neglectible. Therefore, it is not necessary to particularly form the LDD region in this n-channel type TFT. However, similar to the n-channel type TFT, the LDD region can be formed as a hot carrier countermeasure.

Further, when the CMOS circuit for bi-directionally flowing an electric current through a channel forming region, i.e., the CMOS circuit in which roles of the source and drain regions are exchanged is used in the driving circuit, it is preferable for the n-channel type TFT that constitutes the CMOS circuit to form LDD regions such that the channel forming region is sandwiched between the LDD regions. As an example of this, a transmission gate used in the dot sequential driving is given. When a CMOS circuit required to reduce an OFF-state current value as much as possible is used in the driving circuit, the n-channel type TFT forming the CMOS circuit preferably has a Lov region. The transmission gate used in the dot sequential driving can be given also as an example as such.

In reality, when the light emitting device is completed according to Embodiment Modes 1 or 2, it is preferable to perform packaging (sealing) using a protective film (a laminate film, an ultraviolet curable resin film, etc.) that has a high airtight seal property and allows little degasification and a translucent sealing member in order to prevent to be exposed to the outside air. In this case, reliability of OLED is improved by filling the interior of the sealing member with an inert gas atmosphere and arranging a moisture absorbing material (e.g., barium oxide) therein.

Further, after the airtight seal property is improved by processing of packaging, etc., a connector (flexible printed circuit: FPC) is attached to complete the device as a to product. The connector is for connecting, with an external signal terminal, a terminal led out from the element or the circuit which is formed on the substrate. The device in this state is ready to be shipped and is called a self-emission device in this specification.

Furthermore, in accordance with the processes shown in this embodiment, the number of photomasks can be reduced that is need for manufacturing the light emitting is device. As a result, the processes can be reduced, and this contributes to a reduction in the manufacturing costs and an increase in throughput.

Note that it is possible to implement Embodiment 3 in combination with Embodiments 1 to 2.

Embodiment 4

In Embodiment 4, a structure of a light emitting device using inverse-stagger type TFTs according to the present invention will be described.

Figure 13:
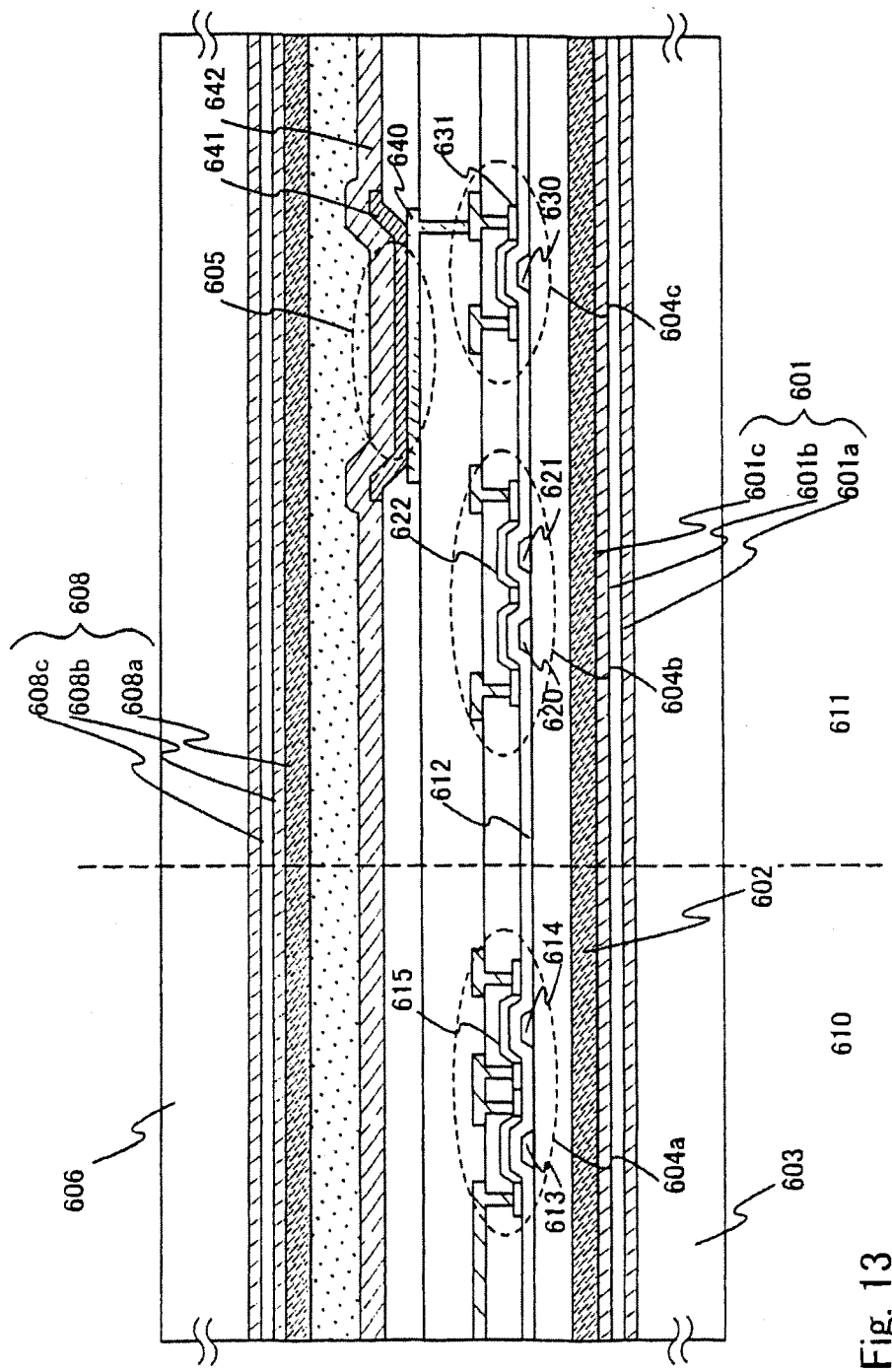
FIG. 13 is a cross-sectional view showing a light emitting device according to the present invention.

FIG. 13 is a cross-sectional view showing a light emitting device according to the present invention. A sealing film 601 is formed on a flexible third substrate 601. The sealing film 601 includes a barrier film 601a, a stress relaxing film 601b and a barrier film 601c.

A sealing film 608 is formed on a flexible second substrate 606. The sealing film 608 includes a barrier film 608a, a stress relaxing film 608b and a barrier film 608c.

Between the sealing films 601 and 608, TFTs, an OLED and other elements are formed. In this embodiment, a TFT 604a included in a driving circuit 610 and TFTs 604b and 604c included in a pixel portion 611 are shown as representative examples.

An OLED 605 includes a pixel electrode 640, an organic light emitting layer 641 and a cathode 642.

The TFT 604a includes gate electrodes 613 and 614, an insulating film 612 formed so as to be in contact with the gate electrodes 613 and 614, and a semiconductor film 615 formed so as to be in contact with the insulating film 612. The TFT 604b includes gate electrodes 620 and 621, the insulating film 612 formed so as to be in contact with the gate electrodes 620 and 621, and a semiconductor film 622 formed so as to be in to contact with the insulating film 612. The TFT 604c includes a gate electrode 630, the insulating film 612 formed so as to be in contact with the gate electrode 630, and a semiconductor film 631 formed so as to be in contact with the insulating film 612.

Although there is shown the example where the inverse-stagger type TFTs are used in the light emitting device manufactured according to Embodiment mode 1, the structure of the present invention is not limited thereto. The inverse-stagger type TFTs may be used in the light emitting device manufactured according to Embodiment mode 2.

Embodiment 4 can be carried out in free combination with Embodiment 1.

Embodiment 5

In Embodiment 5, an example where a bonding layer is removed by spraying a fluid thereon will be described.

As a method of spraying a fluid, a method of spraying a high-pressure water flow from a nozzle on an object (referred to as a water jet method) or a method of spraying a high-pressure gas flow on an object can be used. In the case of the water jet method, an organic solvent, an acid solution or an alkaline solution may be used instead of water. As a gas flow, air, a nitrogen gas, a carbon dioxide gas or a rare gas may be used. Furthermore, a plasma obtained from these gases may also be used. It is important to select an appropriate fluid in accordance with a material of the bonding layer and materials of the films and substrates which are not desired to be removed so that such films and substrates are not removed with removal of the bonding layer.

As a bonding layer, a porous silicon layer or a silicon layer to which hydrogen, oxygen, nitrogen or a rare gas is added is used. In the case where a porous silicon layer is used, an amorphous silicon film or a polycrystalline silicon film may be subjected to anodization to provide porousness thereto for use.

Figure 14:
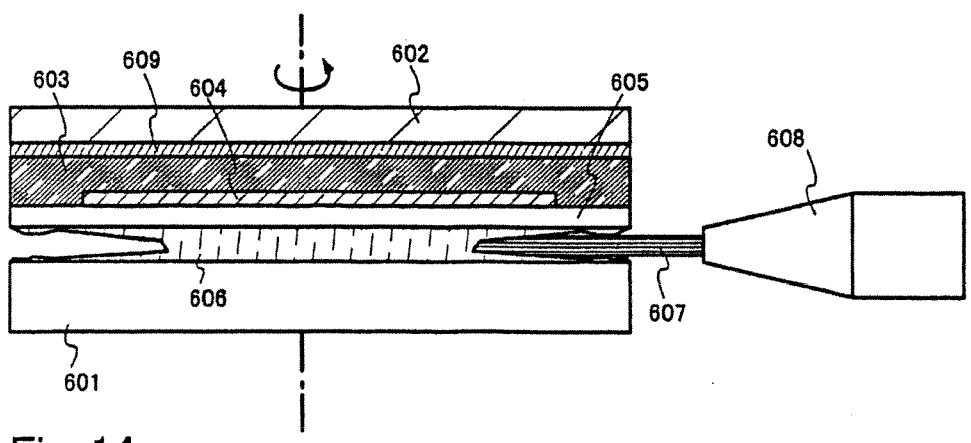
FIG. 14 is a diagram showing removal of a bonding layer by a water jet method.

FIG. 14 shows removal of a bonding layer by a water jet method. An OLED 604 is provided between substrates 603 and 606. The OLED 604 is covered with an insulating film 603. A sealing film 609 including a plurality of insulating films is provided between the insulating film 603 and the substrate 606.

An insulating film 605 and a bonding layer 606 are provided between the to substrate 603 and the OLED 604. The bonding layer 606 is in contact with the substrate 603. Although only the OLED is representatively shown in FIG. 14, TFTs and other elements are normally provided between the insulating films 605 and 603.

The bonding layer 606 may have a thickness of 0.1 to 900 µm (preferably, 0.5 to 10 µm). In Embodiment 5, an SOG film having a thickness of 1 µM is used as the bonding layer 606.

A fluid 607 is sprayed from a nozzle 608 onto the bonding layer 606. In order to efficiently spray the fluid 607 onto the entire exposed portion of the bonding layer 606, it is recommended to spray the fluid while rotating the bonding layer 606 around a central line perpendicular to the substrate 601, as is indicated with an arrow in FIG. 14.

The fluid 607, to which a pressure of $1\times10^7$ to $1\times10^9$ Pa (preferably, $3\times10^7$ to $5\times10^2$ Pa) is applied, is sprayed from the nozzle 608 onto the exposed portion of the bonding layer 606. Since the sample rotates, the fluid 607 is sprayed along the exposed surface of the bonding layer 606.

When the fluid emitted from the nozzle 608 is sprayed onto the bonding layer 606, the bonding layer is broken due to impact for its fragility and then is removed or is chemically removed. As a result, the bonding layer 606 is broken or removed to separate the substrate 603 and the insulating film 605 from each other. In the case where the separation is achieved by breaking the bonding layer 606, the remaining bonding layer may be removed by etching.

As the fluid 607, a liquid such as water, an organic solvent, an acid solution or an alkaline solution may be used. Alternatively, air, a nitrogen gas, a carbon dioxide gas or a rare gas may be also used. Furthermore, a plasma obtained from these gases may be used.

Embodiment 5 can be carried out in combination with Embodiments 1 to 4.

Embodiment 6

In this embodiment, an external light emitting quantum efficiency can be remarkably improved by using an organic light emitting material by which phosphorescence from a triplet exciton can be employed for emitting a light. As a result, the power consumption of OLED can be reduced, the lifetime of OLED can be elongated to and the weight of OLED can be lightened.

The following is a report where the external light emitting quantum efficiency is improved by using the triplet exciton (T. Tsutsui, C. Adachi, S. Saito, Photochemical Processes in Organized Molecular Systems, ed. K. Honda, (Elsevier Sci. Pub., Tokyo, 1991) p. 437).

The molecular formula of an organic light emitting material (coumarin pigment) reported by the above article is represented as follows.

Chemical formula 1

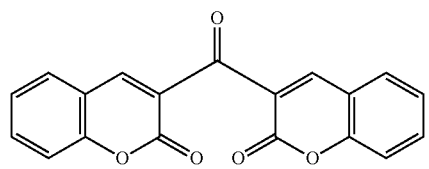

(M. A. Baldo, D. F. O'Brien, Y. You, A. Shoustikov, S. Sibley, M. E. Thompson, S. R. Forrest, Nature 395 (1998) p. 151)

The molecular formula of an EL material (Pt complex) reported by the above article is represented as follows.

Chemical formula 2

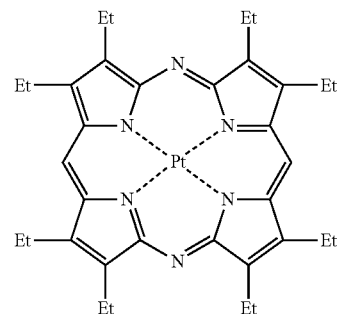

(M A Baldo, S. Lamansky, P. E. Burrows, M. E. Thompson, S. R. Forrest, Appl. Phys. Lett., 75 (1999) p. 4.) (T. Tsutsui, M.-J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502)

The molecular formula of an EL material (Ir complex) reported by the above article is represented as follows.

Chemical formula 3

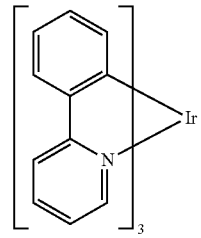

As described above, if phosphorescence from a triplet exciton can be put to practical use, it can realize the external light emitting quantum efficiency three to four times as high as that in the case of using fluorescence from a singlet exciton in principle.

The structure according to this embodiment can be freely implemented in combination of any structures of the Embodiments 1 to 5.

Embodiment 7

A film made of an organic light emitting material is generally formed by an ink jet method, a spin-coating method or an evaporation method. In Embodiment 7, a method for forming an organic light emitting layer other than the above-mentioned methods will be described.

In this embodiment, a film containing molecular assemblies of an organic light emitting material is formed on a substrate under an inert gas atmosphere by spraying, using a colloidal solution in which molecular assemblies constituting the organic light emitting to material are dispersed (also referred to as a sol). The organic light emitting material is present as particles, each being an assembly of several molecules in a liquid.

Figure 15:
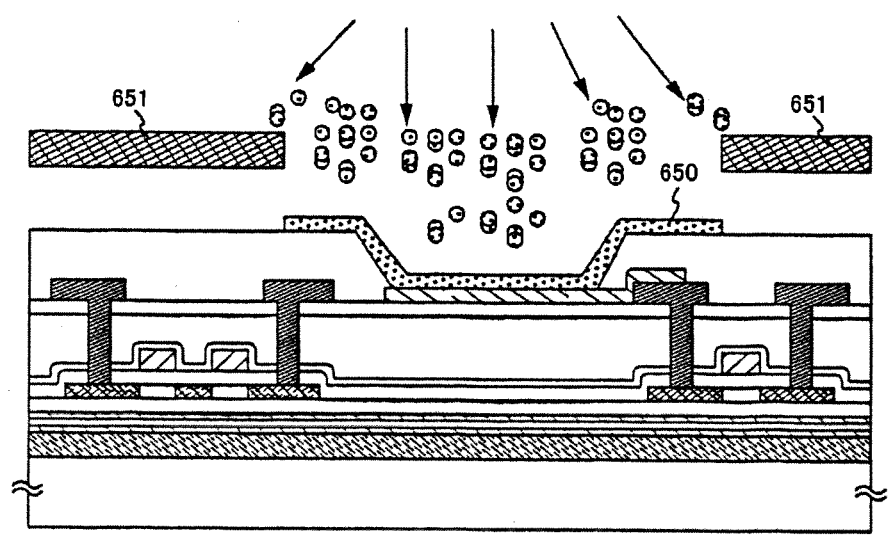
FIG. 15 is a diagram showing formation of an organic light emitting layer by spraying.

FIG. 15 shows the formation of an organic light emitting layer 650 by spraying a composition from a nozzle (not shown) in an inert gas (in this embodiment, a nitrogen gas). The composition is obtained by dispersing tris(2-phenylpyridine) iridium (Ir(ppy)$_3$) which is an iridium complex serving as an organic light emitting material, and bathocupuroine (BCP) which is an organic light emitting material serving as a host (hereinafter, referred to as a host material) in toluene.

In FIG. 15, the organic light emitting layer 650 is selectively formed to have a thickness of 25 to 40 nm by using a mask 651. Both the iridium complex and BCP are insoluble to toluene.

In practice, there are some cases where the organic light emitting layer is used in a single-layered form and the other cases where it is used in a multi-layered form. In the case where the organic light emitting layer has a multi-layered structure, another (other) organic light emitting layer(s) is (are) formed in a similar manner after formation of the organic light emitting layer 650. In this case, all the deposited organic light emitting layers are collectively referred to as the organic light emitting layer.

A film formation method of this embodiment allows the formation of a film even if the organic light emitting material in a liquid is in any state. Particularly, this method permits an organic light emitting layer with good quality to be formed by using an organic light emitting material that is hardly dissolved. Moreover, since a film is formed by spraying a liquid containing an organic light emitting material with use of a carrier gas, the film formation can be achieved within a short period of time. A method of producing a liquid containing an organic light emitting material to be sprayed can be extremely simplified. Furthermore, in this embodiment, a mask is used to form a film having a desired pattern, so that the film formation is conducted through an opening of the mask. In addition, in order to efficiently use an expensive organic light emitting material, it is possible to collect the organic light emitting material adhered to the mask for reuse.

The ink jet method and the spin-coating method have a restriction in that an organic light emitting material having a high solubility to a solvent cannot be used. The evaporation has a restriction in that an organic light emitting material which decomposes before evaporation cannot be used. However, the film formation method of this embodiment is not affected by the above-mentioned restrictions.

As examples of the organic light emitting material suitable for the film formation method of this embodiment, quinacridon, tris(2-phenylpyridine) iridium, bathocuproine, poly(1, 4-phenylenevinylene), poly(1,4-naphthalenevinylene), poly (2-phenyl-1,4-phenylenevinylene), polythiophene, poly(3-phenylthiophene), poly(1,4-phenylene), poly(2,7-fluorene) and the like can be given.

The structure of Embodiment 7 can be carried out in free combination with any of Embodiments 1 to 6.

Embodiment 8

Figure 16A:
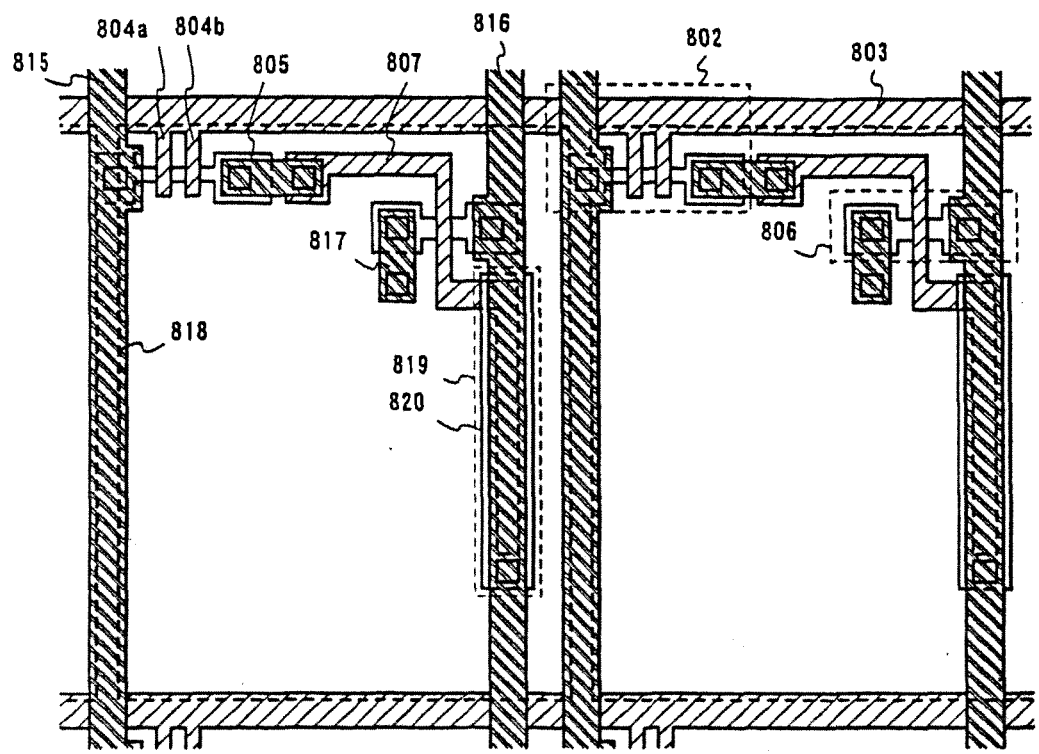
FIG. 16A is a top view showing a pixel.
Figure 16B:
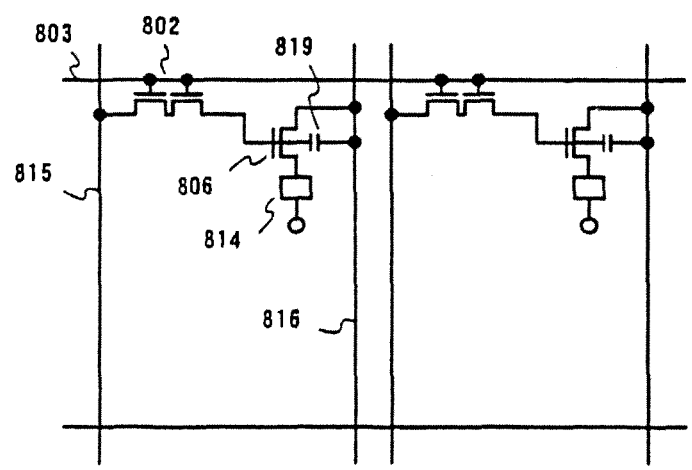
FIG. 16B is a circuit diagram of a pixel.

This embodiment gives descriptions that are more detailed of the pixel portion of the light emitting device obtained by the present invention in Embodiment 8. The top structure of the pixel portion is shown in FIG. 16A whereas the circuit diagram thereof is shown in FIG. 16B. Common reference symbols are used in FIG. 16A and FIG. 16B to be cross-referred.

A switching TFT 802 has a source connected to a source wiring 815 and has a drain connected to a drain wiring 805. The drain wiring 805 is electrically connected to a gate electrode 807 of a current controlling TFT 806. The current controlling TFT 306 has a source electrically connected to a current supply line 816 and has a drain electrically connected to a drain wiring 817. The drain wiring 817 is electrically connected to a pixel electrode (cathode) 818 indicated by the dotted line.

A capacitor storage is formed here in a region denoted by 819. The capacitor storage 819 is composed of a semiconductor film 820 that is electrically connected to the current supply line 816, an insulating film (not shown) on the same layer as the gate insulating film, and the gate electrode 807. A capacitor composed of the gate electrode 807, the same layer (not shown) as the first interlayer insulating film, and the current supply line 816 may also be used as a storage capacitor.

This embodiment 8 can be combined with Embodiments 1 to 7.

Embodiment 9

Figure 17:
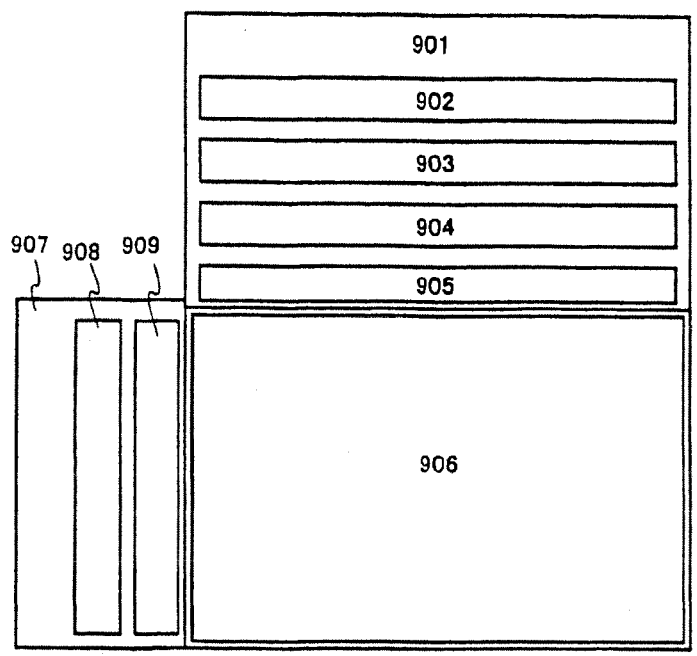
FIG. 17 is a schematic diagram showing a circuit structure of a light emitting device.

This embodiment shows an example of the circuit structure of the light emitting device with reference to FIG. 17. The circuit structure shown in this embodiment is for digital driving. The structure according to this embodiment has a source side driver circuit 901, a pixel portion 906 and a gate side driver circuit 907.

The source side driver circuit 901 is provided with a shift register 902, a latch (A) 903, a latch (B) 904, and a buffer 905. In the case of analog driving, a sampling circuit (transfer gate) is provided in place of the latches (A) and (B). The gate side driver circuit 907 is provided with a shift register 908 and a buffer 909. However, the buffer 909 is not always necessary to provide.

In this embodiment, the pixel portion 906 includes a plurality of pixels, each of which is provided with OLED. It is preferable that a cathode of OLED is electrically connected to a drain of a current controlling TFT.

The source side driver circuit 901 and the gate side driver circuit 907 are composed of n-channel TFTs or p-channel TFTs obtained in accordance with Embodiments 2 to 4.

Though not shown, another gate side driver circuit may be added opposite the gate side driver circuit 907 across the pixel portion 906. In this case, two of the gate side driver circuits have the same structure and share a gate wiring, so that the other can send a gate signal in place of the broken one to make the pixel portion operate normally.

This embodiment can be combined with Embodiments 1 to 8.

Embodiment 10

In Embodiment 10, a roll-to-roll method of forming a sealing film on a flexible plastic substrate will be described.

Figure 19:
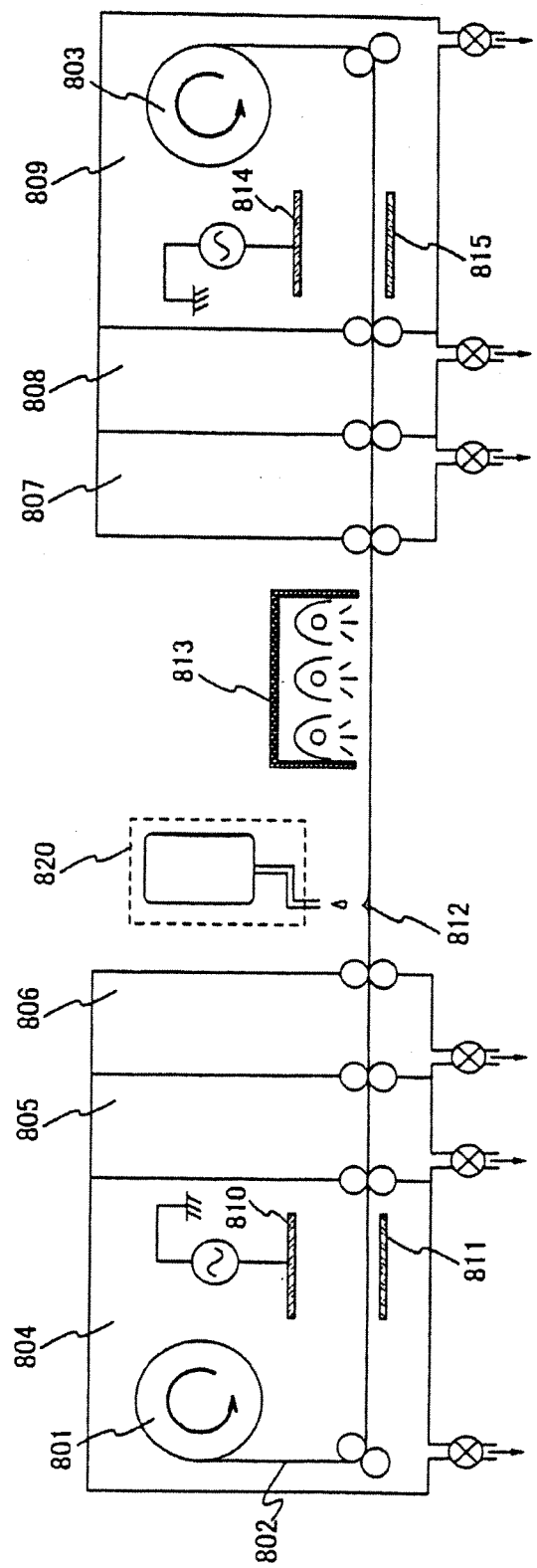
FIG. 19 is a diagram showing a sealing film formation apparatus employing a roll-to-roll method.

FIG. 19 shows a structure of a film formation apparatus according to Embodiment 10 in a simplified manner. The film formation apparatus according to the present invention shown in FIG. 19 includes two chambers 804 and 809 for forming a barrier film by sputtering, chambers 805 to 808 for controlling an air pressure within the to chambers 804 and 809, a mechanism 820 for applying a resin, and a mechanism 813 for curing an applied resin.

The chamber 804 for forming a barrier film by sputtering includes a roll 801 for unwinding a substrate 802, a voltage application electrode 810 having a target, and a heater 811 also serving as an electrode. The chamber 809 for forming a barrier film by sputtering is includes a roll 803 for winding the substrate 802, a voltage application electrode 814 having a target, and a heater 815 also serving as an electrode.

The substrate 802 is carried from the unwinding roll 801 to the winding roll 803.

In this embodiment, a silicon nitride film is formed in the chamber 804. More specifically, an air pressure within the chamber 804 is kept to 0.4 Pa by a turbo-molecular pump or the like. In this state, argon at a flow rate of 10 sccm, nitrogen at 35 sccm and hydrogen at 5 sccm are supplied.

The substrate 802, on which a silicon nitride film is formed in the chamber 804, successively passes through the chambers 805 and 806, and then is placed under the atmospheric pressure. A resin 812 is applied onto the substrate 802 by the mechanism 820 for applying a resin. The chambers 805 and 806 are both evacuated to a vacuum by a turbo-molecular pump or the like, and are provided so as to keep an air pressure within the chamber 804 to a desired level without being affected by the atmospheric pressure. Although the two chambers 805 and 806 are used to prevent the influence of the atmospheric pressure, only one chamber may be sufficient depending on the case. It is possible to provide three or more chambers as the need arises.

As the resin 812, thermally polymerizable polyethylene is used in this embodiment. After application of the resin 812, the substrate 802 is heated with a halogen lamp 813 so as to cure the applied resin 812.

More specifically, in this embodiment, a halogen lamp for heating the substrate is provided as the mechanism 813 for curing the applied resin. In the case where the resin is to be cured by heating, means of heating is not limited to a halogen lamp; an infrared lamp, a metal halide lamp, a xenon arc lamp, a carbon arc lamp, a high-pressure sodium lamp or a high-pressure mercury lamp can be also used. Moreover, means of heating is not limited to a lamp; heating may be performed by using a heater or the like. In the case to where the resin is not thermally curable but ultraviolet curable, the resin can be cured by radiation of an ultraviolet ray.

The substrate 802, on which the resin film is formed, is delivered to the chambers 807 and 808 to finally reach the chamber 809. The chambers 807 and 808 are both evacuated to a vacuum by a turbo-molecular pump or the like; and are provided so as to keep an air pressure within the chamber 809 to a desired level without being affected by the atmospheric pressure. Although two chambers 807 and 808 are used to prevent the influence of the atmospheric pressure, only one chamber may be sufficient depending on the case. It is possible to provide three or more chambers as the need arises.

A silicon oxynitride film is formed in the chamber 809. More specifically, while keeping an air pressure within the chamber 809 to 0.4 Pa by a turbo-molecular pump or the like, argon at a flow rate of 10 sccm, nitrogen at 31 sccm, hydrogen at 5 sccm and $N_2O$ at 4 sccm are supplied.

The substrate 802, on which the silicon oxynitride film is formed, is rewound by the winding roll 803.

The above-described structure facilitates the mass production of the flexible plastic substrate which has a sealing film including a stress relaxing film interposed between two barrier films.

Although the film formation apparatus for forming the sealing film including a laminate of a silicon nitride film, a film made of polyethylene, and a silicon oxynitride film is described in this embodiment, a material of the barrier film is not limited thereto. In addition, a material of the stress relaxing film is not limited to polyethylene; any resin material having a smaller stress than that of the barrier film may be used.

Although two barrier films are formed in this embodiment, three or more barrier films may be formed. In such a case, it is sufficient to provide a chamber for sputtering, a chamber for preventing the influence of the atmospheric pressure, a mechanism for applying a resin, and a mechanism for curing the applied resin, in a manner suitable for each film formation.

Moreover, a multi-layered sealing film including barrier films and a stress relaxing film may be formed by repeating the step of rewinding the wound substrate to around the unwinding roll 801 after winding up the substrate 302 around the winding roll 803.

Embodiment 10 may be combined with any of Embodiments 1 to 9.

Embodiment 11

Being self-luminous, a light emitting device using a light emitting element has better visibility in bright places and wider viewing angle than liquid crystal display devices. Therefore, the light emitting device can be used to the display device of various electric appliances.

Given as examples of an electric appliance that employs a light emitting device manufactured in accordance with the present invention are video cameras, digital cameras, goggle type displays (head mounted displays), navigation systems, audio reproducing devices (such as car audio and audio components), notebook computers, game machines, portable information terminals (such as mobile computers, cellular phones, portable game machines, and electronic books), and image reproducing devices equipped with recording as media (specifically, devices with a display device that can reproduce data in a recording medium such as a digital video disk (DVD) to display an image of the data). Wide viewing angle is important particularly for portable information terminals because their screens are often slanted when they are looked at. Therefore it is preferable for portable information terminals to employ the light emitting device using the light emitting element. Specific examples of these electric appliance are shown in FIGS. 18A to 18H.

Figure 18A:
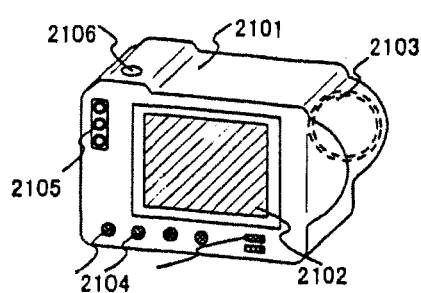
FIGS. 18A to 18D are diagrams, each showing an electronic appliance using a light emitting device according to the present invention.

FIG. 18A shows a digital still camera, which is composed of a main body 2101, a display unit 2102, an image receiving unit 2103, operation keys 2104, an external connection port 2105, a shutter 2106, etc. The light emitting device manufactured in accordance with the present invention can be applied to the display unit 2102.

Figure 18B:
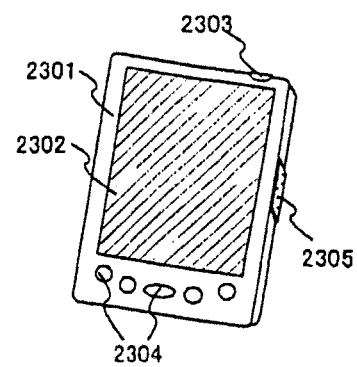

FIG. 18B shows a mobile computer, which is composed of a main body 2301, a display unit 2302, a switch 2303, operation keys 2304, an infrared port 2305, etc. The light emitting device manufactured in accordance with the present invention can be applied to the display unit 2302.

Figure 18C:
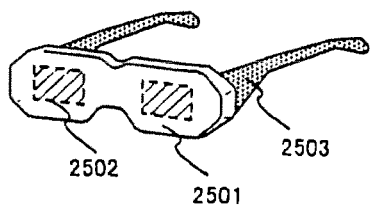

FIG. 18C shows a goggle type display (head mounted display), which is to composed of a main body 2501, display units 2502, and arm units 2503. The light emitting device manufactured in accordance with the present invention can be applied to the display units 2502.

Figure 18D:
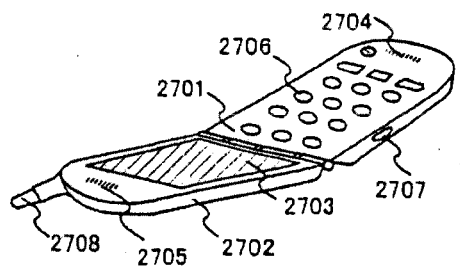

FIG. 18D shows a cellular phone, which is composed of a main body 2701, a case 2702, a display unit 2703, an audio input unit 2704, an audio output unit 2705, operation keys 2706, an external connection port 2707, an antenna 2708, etc. The light emitting device manufactured in accordance with the present invention can be applied to the display unit 2703. If the display unit 2703 displays white letters on black background, the cellular phone consumes less power.

If the luminance of light emitted from organic materials is raised in future, the light emitting device can be used in front or rear projectors by enlarging outputted light that contains image information through a lens or the like and projecting the light.

These electric appliances now display with increasing frequency information sent through electronic communication lines such as the Internet and CATV (cable television), especially, animation information. Since organic materials have very fast response speed, the light emitting device is suitable for animation display.

In the light emitting device, light emitting portions consume power and therefore it is preferable to display information in a manner that requires less light emitting portions. When using the light emitting device in display units of portable information terminals, particularly cellular phones and audio reproducing devices that mainly display text information, it is preferable to drive the device such that non-light emitting portions form a background and light emitting portions form text information.

As described above, the application range of the light emitting device manufactured by using the deposition device of the present invention is so wide that it is applicable to electric appliances of any field. The electric appliances of this embodiment can employ any light emitting device shown in Embodiments 1 to 10.

According to the present invention, owing to a laminate structure of a plurality of barrier films, even if a crack occurs in one of the barrier films, the other barrier films can effectively prevent moisture or oxygen from penetrating into the organic light emitting to layer. Furthermore, even if the quality of the barrier films is degraded due to a low film formation temperature, the laminate structure of a plurality of barrier films can effectively prevent moisture or oxygen from penetrating into the organic light emitting layer.

Furthermore, a stress relaxing film having a smaller stress than that of the barrier films is interposed between the barrier films, so that a stress of the entire insulating films can be reduced. Thus, the barrier films sandwiching the stress relaxing film therebetween hardly suffer a crack due to stress as compared with a single-layered barrier film even when the multi-layered barrier film has the same total thickness as that of the single-layered barrier film.

Accordingly, the multi-layered barrier film can effectively prevent moisture or oxygen from penetrating into the organic light emitting layer as compared with a single-layered barrier film even when the multi-layered barrier film has the same total thickness as that of the single-layered barrier film. Furthermore, a crack due to stress is hardly generated in such a multi-layered barrier film.

What is claimed is:
1. A light emitting device comprising:
a transistor over a substrate, the transistor comprising:
   a first electrode;
   a first insulating film over the first electrode;
   a semiconductor film overlapping with the first electrode with the first insulating film therebetween;
   a second insulating film over the semiconductor film;
   a second electrode overlapping with the semiconductor film with the second insulating film therebetween; and
a third insulating film over the second electrode;
an organic light emitting diode over the third insulating film, the organic light emitting diode including an anode, an organic light emitting layer and a cathode;
a fourth insulating film on and in contact with the organic light emitting diode;
a first film comprising silicon nitride over the fourth insulating film; and
a second film comprising silicon nitride over the first film,
wherein the organic light emitting diode emits white light.

2. The light emitting device according to claim 1, wherein the substrate has flexibility.

3. The light emitting device according to claim 1, further comprising:
an interlayer insulating film over the semiconductor film; and
a wiring connected to the semiconductor film through a contact hole in the interlayer insulating film.

4. The light emitting device according to claim 1, wherein the cathode is located over the anode, and wherein the anode is a transparent conductive film.

5. The light emitting device according to claim 1, wherein the cathode includes MgAg.

6. The light emitting device according to claim 2, wherein the light emitting device further comprising a capacitor storage over the substrate.

7. The light emitting device according to claim 1, further comprising a FPC, and a driving circuit.

8. An electric appliance comprising the light emitting device according to claim 1, wherein the electric appliance is one selected from the group consisting of a digital still camera, a mobile computer, a goggle type display, and a cellular phone.

* * * * *